(12) United States Patent
Reed et al.

(10) Patent No.: US 6,756,605 B1
(45) Date of Patent: Jun. 29, 2004

(54) MOLECULAR SCALE ELECTRONIC DEVICES

(75) Inventors: Mark A. Reed, Monroe, CT (US); James M. Tour, Bellaire, TX (US); Jia Chen, New Haven, CT (US); Adam M. Rawlett, Chandler, AZ (US); David W. Price, Cypress, TX (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 09/551,716

(22) Filed: Apr. 18, 2000

Related U.S. Application Data

(63) Continuation-in-part of application No. 09/527,885, filed on Mar. 20, 2000, now abandoned.
(60) Provisional application No. 60/157,149, filed on Sep. 30, 1999, and provisional application No. 60/154,716, filed on Sep. 20, 1999.

(51) Int. Cl.[7] .......................... H01L 35/24; H01L 29/06
(52) U.S. Cl. .......................................... 257/40; 257/41
(58) Field of Search .............................. 257/40, 41, 25; 427/539; 428/215; 525/489; 548/562; 430/31, 64, 83; 365/151

(56) References Cited

U.S. PATENT DOCUMENTS

| | | | |
|---|---|---|---|
| 4,629,798 A | * 12/1986 | Traynor ...................... 548/562 |
| 5,110,669 A | * 5/1992 | Knobel et al. ............... 428/215 |
| 5,475,341 A | 12/1995 | Reed ........................... 327/566 |
| 5,563,424 A | * 10/1996 | Yang et al. .................... 257/40 |
| 5,589,692 A | 12/1996 | Reed ............................ 257/23 |
| 5,591,530 A | * 1/1997 | Warner et al. ............... 428/480 |
| 5,814,833 A | * 9/1998 | Jenekhe ........................ 257/40 |
| 5,989,766 A | * 11/1999 | Jeong et al. ................... 430/83 |

OTHER PUBLICATIONS

U.S. patent application Ser. No. 08/595,130, Reed et al., filed Feb. 1, 1996.
Reed et al. "Conductance of a Molecular Junction", Science, vol. 278, Oct. 10, 1997, pp 252–254.
Pearson and Tour, "Rapid Syntheses . . . with Thioester Termini. Potential . . . Wires . . . Clips", J. Org. Chem., Mar. 7, 1997, vol. 62, pp 1376–1387.
Tour et al., "Self–Assembled Monolayers and Multilayers of Conjugated . . . Adsorbates. Understanding . . . Molecular Wires and Gold Surfaces", J. Am. Chem.. Soc. , Sep. 20, 1995, vol. 117, pp 9529–9534.
Chen et al., "Electronic transport . . . metal junctions", Chemical Physics Letters, vol. 313, Nos. 5,6, Nov. 19, 1999, pp 741–748.
Chen et al., "Large On–Off Ratios . . . in a Molecular Electronic Device", Science, Nov. 19, 1999, vol. 286, No. 5444, pp 1550–1552.

(List continued on next page.)

*Primary Examiner*—Trong Phan
(74) *Attorney, Agent, or Firm*—Ropes & Gray LLP

(57) ABSTRACT

Molecular scale electronic devices are disclosed. Such devices include at least two conductive contacts, and a conductive path bridging the contacts. The conductive path is able to be written into a perturbed state by a voltage pulse, which can be of high or low conductivity, relative to an initial state. The conductive path comprises organic molecules including at least one electron-withdrawing group. Room temperature negative differential resistance is exhibited by the devices.

16 Claims, 10 Drawing Sheets

OTHER PUBLICATIONS

Bumm et al., "Are Single Molecular Wires Conducting?", Science, Mar. 22, 1996. vol. 271, pp 1705–1707.

Metzger. et al., "Unimolecular Electrical Ractification . . . Tricyanoquinodimethanide", J. Am. Chem.. Soc., Oct. 29, 1997, vol. 119, No. 43, pp 10455–10466.

Seminano et al., "Theoretical Interpretation of Conductivity . . . Sandwich. A Molecular . . . Controller", J. Am. Chem. Soc., Apr. 29, 1998, vol. 120, No. 16, pp 3970–3974.

Chen et al., "Placement of conjugated oligomers . . . by scanned probe . . . lithography", Applied Physics Letters, Aug. 2, 1999, vol. 75, No. 5, pp 624–626.

Reinerth et al., "Molecular scale electronics: syntheses and testing", Nanotechnology, 1998, vol. 9, pp 246–250.

Allara et al., "Evolution of Strategies . . . of Molecule–Based Devices", Reprinted from Molecular Electronics: Science and Technology, Jun. 30, 1998, vol. 852 of the Annals of the New York Academy of Sciences, pp 349–370.

Tour et al., "Molecular Scale Electronics: A Synthetic/Computational . . . Computing", J. Am. Chem. Soc. 1998, 120, pp 8486–8493.

Tour et al., "Recent Advances in Molecular Scale Electronics", Molecular Electronics: Science and Technology, 1998, Ann. N.Y. Acad. Sci., vol. 852, pp 197–204.

Weiss et al., "Probing Electronic . . . Self–Assembled Monolayers", Molecular Electronics: Science and Technology, Ann. N.Y. Acad. Sci., 1998, vol. 852, pp 145–168.

Reinerth et al., "Self–Assembled Monolayer . . . Molecular Scale Electronics", Polym. Mater., Sci. Engin. (Am. Chem. Soc., Div. Polym. Chem.), 1998, vol. 78, pp 178–179.

Collier et al., "Electronically Configurable . . . Gates", Science, Jul. 16, 1999, vol. 285, pp 391–394.

Yao and Tour, "Facile Convergent Route to Molecular Caltrops", J. Org. Chem., 1999, vol. 64, No. 6, pp 1968–1971.

Reinerth and Tour, Protecting Groups . . . Compounds, J. Org. Chem., 1998, vol. 63, pp 2397–2400.

Zhou et al., "Nanoscale Metal/Self–assembled Monolayer/Metal Heterostructures", Appl. Phys. Lett. Aug. 4, 1997, vol. 71, No. 5, pp 611–613.

Rawlett et al., "Advances In Molecular Scale Electronics: Synthesis and Testing of Molecular Scale Resonant Tunneling Diodes and Molecular Scale Controllers", Polym. Mater. Sci. Eng., vol. 81 (1999), pp 140–141.

\* cited by examiner

MOLECULAR SCALE ELECTRONIC DEVICES

This application is a continuation-in-part of Ser. No. 09/527,885, filed Mar. 3, 2000, now abandoned. This application claims benefit of provisional application No. 60/154,716 filed on Sep. 20, 1999 and No. 60/157,149 filed on Sep. 30, 1999.

STATEMENT REGARDING FEDERALLY SPONSORED RESEARCH AND DEVELOPMENT

This invention was made with government support under N00014-99-0406 awarded by the Office of Naval Research. The government has certain rights in the invention.

TECHNICAL FIELD

This invention relates to electronic devices and methods of making them, and more particularly to such devices and methods utilizing conductive organic materials.

BACKGROUND

Chemically-assembled electronic devices can serve as extensions of conventional circuits and devices. Such chemically-assembled devices include nanoscale or molecular scale electronic components. Molecular scale systems can offer distinct advantages in uniformity of structure and potentially lowered fabrication costs. Additionally, these molecular components can offer the advantage of ease of synthesis and the ability to create large varieties of structure by the use of facile chemical transformations.

SUMMARY

The invention is based on the fabrication of molecular scale electronic devices, and the incorporation of such devices in useful circuits and components. The molecular scale electronic devices include an active reduction-oxidation center, which serves as a key element in the devices' exhibition of large negative differential resistance (NDR), including room temperature NDR, large peak to valley ratios, and switchable conductive states. The molecular scale electronic devices can operate as memory devices by storing high or low conductivity states. The devices are writeable, readable, and erasable.

In one aspect, the invention provides an electronic device including at least two contacts, and a monolayer of conductive organic material forming a conductive path between the contacts. The conductive path includes at least one electron withdrawing group, which can be cyano, isocyano nitro, sulfonyl, $\beta$-carboxyvinyl, sulfinyl, $\beta,\beta$-dicyanovinyl, halogenated alkyl, formyl, carboxyl, carbonyl, alkyloxycarbonyl and aryloxycarbonyl, 1-tetrazolyl, 5-chloro-1-tetrazolyl, carbamoyl, or sulfamoyl, preferably cyano, isocyano and nitro. The device can exhibit high and low conductivity states and can be made repeatedly switchable between the high and said low conductivity states. The low conductivity state can a current of less than about 100 pA or less than about 1 pA.

The high conductivity state can have a current at least about 200 times higher than the low conductivity state, preferably at least about 500 times higher than said low conductivity state, and more preferably at least about 1000 times higher than said low conductivity state. The electron withdrawing group can be bonded to a phenyl ring in the conductive path. At least one electron donating group can also be present in the conductive path.

The conductive path can include at least about 70% of its atoms being sp- or $sp^2$-hybridized atoms and can include alternating ethynyl and aryl groups, or at least one phenyl-ethynyl linkage, with at least one of the phenyl groups substituted with an electron withdrawing group. The conductive path can further include binding groups which bind said conductive path to the contacts, for example, sulfur atoms, oxygen atoms, cyano, carboxy, diazonium salt, halide, isocyano, phosphine, or tellurium and selenium atoms. The conductive path can include biphenyl groups, or ethenyl groups.

In another aspect, the invention provides an electronic device including two contacts, with at least one contact being a palladium contact; and a self-assembled monolayer of a conductive organic molecule including a phenyl-ethynyl-substituted phenyl-ethynyl-phenyl linkage between the contacts, where the substituted phenyl includes at least one nitro group, and where the organic molecule is bonded to said palladium contact by at least one isocyano group on a terminal phenyl of said linkage.

In yet another aspect, the invention includes a memory circuit including an input, an output, a molecular electronic device, as described above, where one contact of the device bridges the input and output, and where another contact of the device is at a low potential, or grounded, and a comparator also bridging the input and output, where the comparator is in electrical communication with a reference voltage. A memory array can be made, including a plurality of these memory circuits arranged in an addressable array.

In yet a further aspect, the invention provides a static random access memory cell including at least a first and a second molecular electronic device as described above, where the first device has one of its contacts connected to a reference voltage, and another of its contacts connected to a node, and where the other device has one of its contacts connected to a low potential or ground, and another of its contacts connected to the node, and where the node is further connected to a low potential, or ground, and can also include a gain component.

The invention involves organic or organometallic molecules that store charge as a self-assembled nanoscale molecular device. The molecular devices form electronically programmable and erasable memory bits. These bits are compatible with conventional threshold levels. The memory bits can be configured into memory cells applicable to random access memory devices. The molecular devices in such memory cells have long bit retention times (over ten minutes).

As used herein, "conjugation" or "conjugated groups" refers to an extended system of overlapping $\pi$ electrons on sp- and/or $sp^2$-hybridized atoms. This results in overlapping $\pi$ electron density not only within each pair of sp- and/or $sp^2$-hybridized atoms, but between them as well.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION

Figure 1:
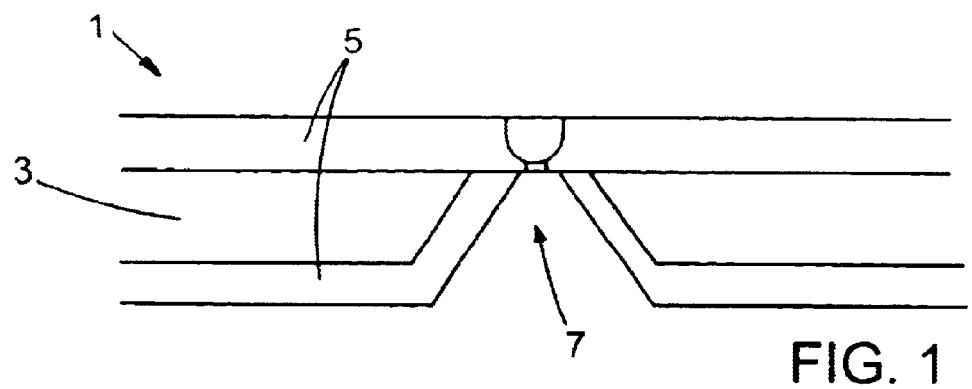
FIG. 1 is a schematic diagram of a particular molecular device.
Figure 2:
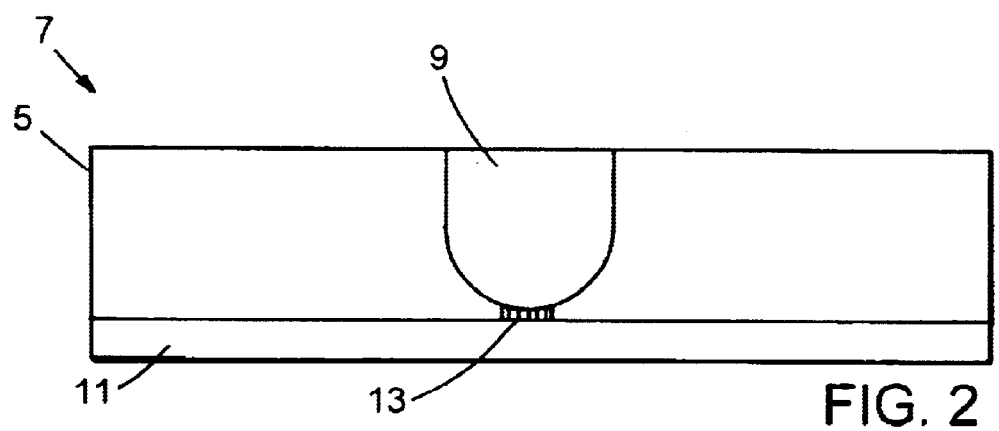
FIG. 2 is a closeup of the molecular device of FIG. 1, showing a pore formed in substrate and contact material.
Figure 3:
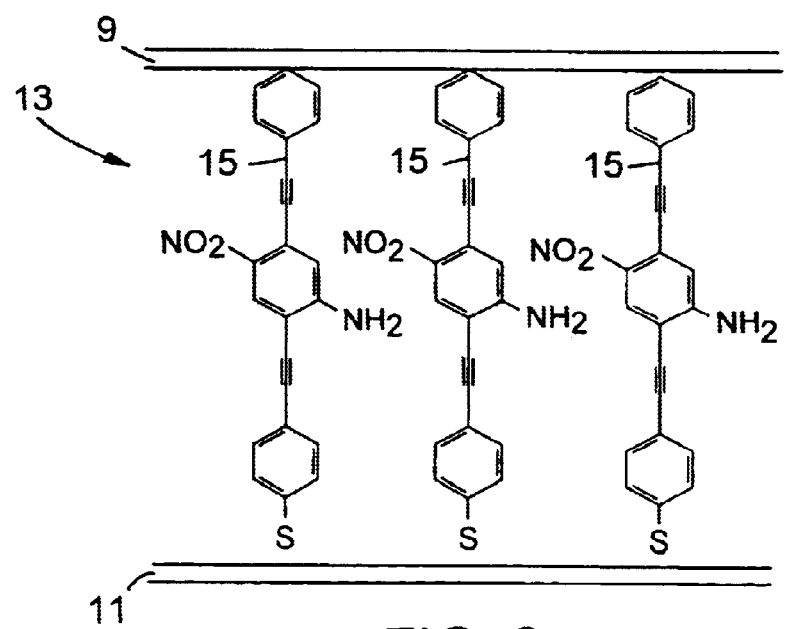
FIG. 3 is a further closeup of the molecular device of FIGS. 1 and 2, showing the molecules making up conductive paths between contacts.

The molecular scale electronic devices include metal contacts, and a monolayer of conductive organic material forming a conductive path between the contacts. FIG. 1 shows a particular embodiment of a molecular scale electronic device 1, including substrate 3, insulating material 5, and cavity 7. Cavity 7 is shown in greater detail in FIG. 2, which includes upper contact material 9 and lower contact material 11, and conductive path pore 13. Conductive path pore 13 is shown in greater detail in FIG. 3, which includes upper and lower contact material 9 and 11, respectively, as well as particular conductive path molecules 15.

Specific aspects of these devices are discussed in U.S. Provisional Applications Serial Nos. 60/157,149, filed Sep. 30, 1999, and 60/154,716, filed Sep. 20, 1999, each of which is hereby incorporated by reference in their entireties.

Conductive Path

Conductive organic material which is able to form a conductive path between metal contacts can be fabricated from substantially conjugated $\pi$-electron systems. Conductive paths are typically fabricated to have two "ends", each of which is in contact with a distinct contact. The lengths of such conductive paths can range from about 5 to about 75 Å, preferably from about 10 to about 75 Å, and more preferably from about 10 to about 50 Å.

These $\pi$-electron systems can be fabricated using molecules with a number of $sp^2$-and/or sp-hybridized carbon, nitrogen, sulfur, or oxygen atoms adjacent to each other, or separated by one, two consecutive, or less preferably three consecutive $sp^3$-hybridized carbon, nitrogen, sulfur, or oxygen atoms. For example, conductive paths can be formed of from about 4 to about 40 atoms, of which a majority, or preferably at least about 70%, are $sp^2$- or sp-hybridized. For example, conductive paths can comprise such all-carbon aromatic groups as phenyl, naphthyl, indyl, azulyl, pentalyl, heptalyl, biphenylenyl, indacenyl, acenaphthyl, fluorenyl, phenalenyl, phenanthrenyl, anthracenyl, triphenylenyl, pyrenyl, naphthacenyl, pentacenyl, hexacenyl, and the like; double-bond containing groups such as ethenyl, or 1,3-butadienyl; and triple bond containing groups such as ethynyl, or 1,3-butadiynyl. Conductive paths can also comprise heteroatom-containing groups such as pyridinyl, pyrazinyl, pyrazolyl, pyrrolyl, imidazolyl, thienyl, benzothienyl, naphthothienyl, thianthrenyl, furyl, pyranyl, isobenzofuranyl, chromenyl, xanthenyl, phenoxathiinyl, pyrimidinyl, pyridaziny, indolizinyl, isoindolyl, indolyl, purinyl, quinolizinyl, quinolyl, phthalazinyl, pteridinyl, carbazolyl, acridinyl, phenanthridinyl, pyrrolinyl, imidazolinyl, indolinyl, and the like. Similarly, conductive paths can comprise combinations of the above groups, such as biphenyl, ethynyl-biphenyl-ethynyl, ethenyl-phenyl-ethenyl, pyridinyl-ethenyl-phenyl, phenyl-ethynyl-phenyl, ethynyl-phenyl-ethynyl, phenyl-ethynyl-phenyl-ethynyl, phenyl-ethynyl-phenyl-ethynyl-phenyl, phenyl-ethenyl-phenyl-ethenyl-phenyl, phenyl-ethenyl-biphenyl-ethenyl-phenyl, biphenyl-ethenyl-biphenyl, phenyl-ethynyl-biphenyl-ethynyl-phenyl, and many other possible combinations, which can be symmetric or asymmetric, regularly or irregularly alternating. Such groups can be arranged in branched or unbranched assemblies to form conductive paths. Conductive paths can also comprise organometallic groups such as chromium-arene groups.

Conductive paths also contain at least one, and optionally several, electron-withdrawing groups. Such groups stabilize radical anion states of organic molecules comprising conductive paths. Such electron-withdrawing groups include cyano, isocyano, nitro, ammonium, sulfonyl (for example, octylsulfonyl, phenylsulfonyl, trifluoromethylsulfonyl, pentafluorophenylsulfinyl, and the like), $\beta$-carboxyvinyl, sulfinyl (for example, t-butylsulfinyl, trisulfinyl, trifluoromethylsulfinyl, pentafluorophenylsulfinyl, and the like), $\beta,\beta$-dicyanovinyl, halogenated alkyl (for example, trifluoromethyl, perfluorooctyl, $\omega$-hydroperfluorododecyl, and the like), formyl, carboxyl, carbonyl (for example, acetyl, pivaloyl, benzoyl, trifluoroacetyl, and the like), alkyl- and aryloxycarbonyl (for example, ethoxycarbonyl, phenoxycarbonyl, and the like), 1-tetrazolyl, 5-chloro-1-tetrazolyl, carbamoyl (for example, dodecycarbamoyl, phenylcarbamoyl, and the like), sulfamoyl (for example, trifluoromethylsulfamoyl, phenylsulfamoyl, ethylsulfamoyl, and the like). Preferred groups include nitro, nitrile and isocyano groups.

Such electron-withdrawing groups are bonded to, or in electronic communication with, atoms in the conductive path, or to atoms in conjugation with the conductive path. For example, an electron-withdrawing group can be directly bonded to phenyl, ethenyl, naphthyl, anthracyl, indolyl and the like, or can be bonded to a group such as an ethenyl or ethynyl group, which is in turn bonded to phenyl, naphthyl, anthracyl, indolyl, ethenyl and the like. The regiochemistry of such electron-withdrawing groups can influence the electronic characteristics. For example, variable regiochemistry of a nitro group on an aromatic ring system can exhibit differences in conduction properties between regioisomers. A single electron withdrawing group, or a number of electron withdrawing groups can be bonded to a single group such as a phenyl group, biphenyl group, pyridinyl group and the like.

Optionally, electron-donating groups can be bonded to, or in electronic communication with, atoms in the conductive path, or to atoms in conjugation with the conductive path. For example, an electron-donating group can be directly bonded to phenyl, naphthyl, anthracyl, indolyl, ethenyl and the like, or can be bonded to a group such as an ethenyl or ethynyl group, which is in turn bonded to phenyl, naphthyl, anthracyl, indolyl, ethenyl and the like. The regiochemistry of such electron-donating groups can influence the electronic characteristics. For example, varying regiochemistry of an amine group on an aromatic ring system can exhibit differences in conduction properties between regioisomers.

Suitable electron-donating groups include alkoxy, amine, hydroxy, thiol, and thioether. Alkoxy groups include those with a carbon chain of one to six carbons containing an oxygen, which may contain one or more double or triple bonds, are straight or branched, and are optionally substituted with one or more halogen atoms. Included within the term alkoxy are methoxy, ethoxy, propoxy, isopropoxy, butoxy, isobutoxy, hexyloxy, heptoxy, and the like. Amine groups include primary, secondary and tertiary amine substituted with alkyl groups. Alkyl groups include those with a carbon chain of one to six carbons, which may contain one or more double or triple bonds and are straight or branched, and optionally substituted with one or more halogen atoms. Included within the term alkyl are methyl, ethyl, propyl, isopropyl, butyl, isobutyl, tert-butyl, cis-2-butene, trans-2-butene, hexyl, heptyl, and the like.

Conductive paths can optionally include barrier groups such as methylene (—$CH_2$—), or ethylene (—$CH_2$—$CH_2$—) groups; oxygen atoms; sulfur atoms; amine (—NR—) groups, where R is hydrogen, alkyl or substituted alkyl; azomethine(—N=CR—) groups, where R is hydrogen, alkyl or substituted alkyl; imine (—C(=NR)—) groups, where R is hydrogen, alkyl or substituted alkyl; azo (—N=N—) groups; azoxy (—$N_2$O—) groups; hydrazine (—NH—NH—) groups, and their alkyl substituted derivatives; amidine (—C(=NH)—NH—) groups; carbodiimide (—N=C=N—) groups; guanidine (—NH—C(NH—)=N—) groups; urea (—NH—C(=O)—NH—) or isourea (—N=C(OH)—NH—) groups; and similar groups. These barrier groups can be interposed directly between the $sp^2$- and/or sp-hybridized atoms or groups mentioned above forming the conductive path. Such barrier groups can also be bonded to, and in electronic communication with, the conductive path, while not themselves forming part of the conductive path. Preferably, such barrier groups are limited in their incorporation in the conductive path, so as not to unduly limit the conductivity of the path. On the other hand, selective incorporation of such non-sp- or $sp^2$-hybridized barrier groups can be used to fine-tune the conductivity of the path. Electron-withdrawing groups and/or electron-donating groups can be included on either side, or both sides, of barrier groups.

In particular examples, suitable conductive paths can include the organic compounds represented by phenylene ethynylenes, such as following general structure 1.

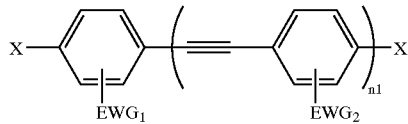

1 where X and $X_2$ are independently selected, and can be thiol or other sulfur-containing group such as thioacetyl, isocyano, cyano, carboxy, diazonium salt, phosphine, halide or hydrogen atoms or group VIb atoms such as tellurium, selenium, and other chalcogens; and where $n_1$ is an integer from 1 to 5, and if $n_1$ is zero, the conductive path includes a substituted phenyl ring and a binding group. $EWG_1$ is optionally present if $n_1$ is greater than 1. At least one of $EWG_1$ and $EWG_2$ is present in the conductive path. $EWG_2$ can be different for different phenyl rings within $n_1$, if $n_1$ is greater than 1. $EWG_1$ and $EWG_2$ are independently selected, and can be cyano, isocyano, nitro, sulfonyl (for example, octylsulfonyl, phenylsulfonyl, trifluoromethylsulfonyl, pentafluorophenylsulfinyl, and the like), β-carboxyvinyl, sulfinyl (for example, t-butylsulfinyl, trisulfinyl, trifluoromethylsulfinyl, pentafluorophenylsulfinyl, and the like), β,β-dicyanovinyl, halogenated alkyl (for example, trifluoromethyl, perfluorooctyl, ω-hydroperfluorododecyl, and the like), formyl, carboxyl, carbonyl (for example, acetyl, pivaloyl, benzoyl, trifluoroacetyl, and the like), alkyl- and aryloxycarbonyl (for example, ethoxycarbonyl, phenoxycarbonyl, and the like), 1-tetrazolyl, 5-chloro-1-tetrazolyl, carbamoyl (for example, dodecycarbamoyl, phenylcarbamoyl, and the like), sulfamoyl (for example, trifluoromethylsulfamoyl, phenylsulfamoyl, ethylsulfamoyl, and the like).

A suitable example of the general structure 1 is presented by structure 2, in which EWG is described as above for either $EWG_1$ or $EWG_2$.

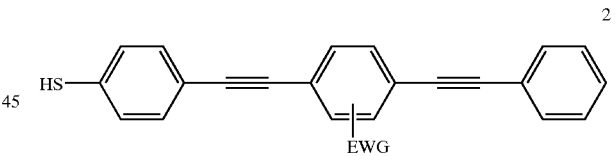

2

Any of these molecules can be substituted, as will be detailed below. Additional linkages can be introduced between any of the phenyl rings, or on any of the terminal phenyl rings, including methylene, ethylene, propylene and other non-sp or $sp^2$-hybridized atoms. Conduction barriers such as, for example, alkyl groups, can be positioned in the conductive path to disrupt the electronic characteristics of molecular devices. For example, resonant tunneling diodes can be fabricated utilizing such altered electronic characteristics. Conductive paths can be synthesized that have no barriers, one or more barriers, two contacts, or more contacts, or any combination of such features.

The end groups shown in the above structure 1 (that is, X and $X_2$) are binding groups that allow attachment to contact material described above. The binding groups can be thiol or other sulfur-containing group such as thioacetyl, isocyano, cyano, carboxy, diazonium salt, phosphine, halide or hydrogen atoms or group VIb atoms such as tellurium, selenium, and other chalcogens. Preferably, not all such binding groups are hydrogen atoms. In some cases, it is believed that expulsion of the X or $X_2$ group occurs upon formation of the conductive path monolayer. For example, if a diazonium salt-containing conductive path is utilized, nitrogen gas can be released upon formation of the conductive path monolayer. If a halide-containing conductive path is utilized, the halogen atom can be expelled upon formation of the conductive path monolayer.

Binding groups can be tailored to optimize the overlap between the lowest unoccupied molecular orbital (LUMO) or the conductive path molecule, and the Fermi levels of the contact material. Covalent, ionic, or other non-covalent interactions can be involved between conductive paths and the contact. In such cases, groups such as hydrogen atoms will be the conductive path atoms nearest the contact. Some embodiments can involve conductive paths in the form of Langmuir-Blodgett films, and therefore such embodiments do not require groups which covalently bond either end of the conductive path to the contact.

The synthesis of such conductive paths can include the synthesis of groups that mask binding groups. For example, thioacetyls represent protected thiols that act as binding sites for the conductive paths to a contact surface. In such instances, removal of the acetyl protecting groups with sodium hydroxide in aqueous tetrahydrofuran and rapid workup can produce thiol groups. Alternately and preferably, ammonium hydroxide can be provided in situ for removal of acetyl groups.

In some preferred embodiments, either one or two of such binding groups can be incorporated into conductive paths. It is also possible for a conductive path to include more than one such binding group on one end of a conductive path.

The monolayers are desirably arranged as assemblies of molecules, occupying the surface of a contact. The assemblies can range from several hundred thousand to several molecules, to the limit of a single molecule. The contact surface area covered by such assemblies are of the nanoscale size range. That is, from about 1 to about 200 nm in diameter. Preferably, the assemblies cover contact surface with diameters from about 1 to about 50 nm. The contact surface area covered by multi-molecule assemblies are typically of roughly circular or oval shape, although other arrangements are also possible, such as square, or rectangular with substantially equal or substantially unequal side lengths. The assemblies can be present in a regular array or an irregular arrangement on the contact surface. Preferably, the arrangement of monolayer assemblies is substantially regular, as suits typical applications such as random access memory devices. For example, assemblies can be arranged every few hundred nanometers, or every few microns, up to every few millimeters. Preferably, the space between assemblies will be as small as possible to maximize the use of space on the contact or substrate surface.

Contacts

The devices of the invention include at least two contacts. To each end of the conductive path described above, a contact is made, either by a covalent bond, by an ionic bond, or by through-space interaction with the conductive path.

The contacts are made of any highly conductive material or conductive material with a thin (less than about 10 Angstroms) insulating, that is, oxide layer. Metal contacts can be used, and any metal is suitable, particularly those commonly used in electronics, such as copper, gold, palladium, titanium, silver, and the like. The metal is preferably of moderate smoothness, but can otherwise be of any useful topology or surface geometry. The contacts need not be pure metal. For example, the contacts can be surfaces of highly conductive material deposited across at least a portion of a material of lesser conductivity. In the fabrication of such contacts, any suitable conventional method can be used to create metal contacts that can readily be equipped with electrical contacts. For example, metal can be deposited on a substrate such as a silicon wafer, for example by a method such as thermal evaporation, sputtering, laser assisted deposition techniques, or chemical deposition techniques. Typically, an insulating layer such as silicon nitride, or silicon oxide is then deposited on the metal surface, by methods known in the art. The insulating layer can then be selectively removed in locations in which it is desired to establish molecular scale electronic devices. The removal of insulating material can be carried out, for example, by photolithography, or other known methods. Such a prepared contact is then ready for self-assembled monolayer formation, Langmuir Blodgett film formation, or other method of establishing a monolayer of conductive material. Particular examples of such methods will be detailed below.

The conductive paths are disposed on the contact in the form of an ordered monolayer. Preferably, the density of the monolayer is comparatively high. That is, given the possible number of sites on the contact available for conductive path molecules to bind, as many of such sites as possible will be occupied by the molecules. One method of providing such an ordered monolayer is by a self-assembled monolayer (SAM) method. Such methods for providing well-defined, stable and reproducible metallic contacts to self-assembled monolayers of conductive paths are demonstrated, for example, in Zhou et al., *Appl. Phys. Lett.* 71, (1997) 611–613, which is hereby incorporated by reference in its entirety.

Another way of providing monolayers of conductive paths is by formation of a Langmuir-Blodgett (L-B) film. Such a film can be constructed by transferring mono-layers of conductive paths, floating on a liquid surface to a solid substrate. In such films, the thickness and molecular arrangement of the film can be controlled at the molecular level. Such films generally require conductive paths having hydrophilic and hydrophobic ends. For example, a molecule with a hydrophilic group such as a carboxylic acid, and a hydrophobic group such as a $C_5$–$C_{15}$ alkyl group can be synthesized.

After deposition of the SAM or L-B film, a layer of contact material is deposited on the top) of the SAM. The methods of Zhou et al. are designed to ensure that the deposition of metal atoms accumulate at the SAM surface, and do not penetrate into the organic layer. The material constituting the contact layer on top of the SAM can be the same or different than that on which the SAM is deposited.

The contacts can be of any convenient shape. For some applications, wafers of silicon coated with metal can be used. The metal contacts can be surfaces that are substantially parallel to each other.

Synthesis of Conductive Paths

The class of conductive paths represented by general structure 1 can be synthesized according to a general synthetic procedure as follows. A dihalobenzene, which can be further substituted with electron withdrawing groups or optionally additional electron donating groups can be used as a starting material. For example, the starting material can be a molecule such as p-bromoiodobenzene, or 2-bromo5-iodo-nitrobenzene. This material can be monocoupled to a triaryl- or trialkylsilylacetylene using a method such as the Sonagashura coupling procedure. The product of this reaction can then be coupled to an electron withdrawing group- or electron-donating group-substituted or unsubstituted phenylacetylene using the same coupling reagents, but a higher temperature. Terminal silyl prototection can be removed with typical reagents such as potassium carbonate, and the product reacted with a haloaryl group including a masked or unmasked binding group. This haloaryl group can also include electron withdrawing groups and/or electron donating groups. For example, this haloaryl group can be a halothioacetylbenzene, such as p-iodothioacetylbenzene.

Conductive paths including biphenyl groups can be constructed analogously, by dihalogenating, for example, 4,4'-dibrominating, a substituted or unsubstituted biphenyl group. For example, a 2,2'-dinitro- or 2,2'-dicyanobiphenyl can be used as a starting material. Such material can be coupled to trialkylsilylacetylene at 4- and 4'-positions of the biphenyl ring. The terminal acetylenes can be revealed and coupled to haloaryl groups by the general methods described herein. The haloaryl groups can further comprise masked or unmasked binding groups.

Such synthetic strategies are applicable to a wide variety of aryl groups, including heteroaromatic structures. For example, electron withdrawing group-substituted bipyridyl groups can be used as starting materials by coupling pairs of nitro-halo-pyridine with copper reagents. Halogenation of the resulting dimer gives a product which can be used in the above described coupling procedures.

Properties of the Devices

The molecular devices described herein have useful electronic properties. For example, they can exhibit negative differential resistance and this property can be observed at temperatures of up to 300 K. at least. Their current vs. voltage, I(V), curves can exhibit non-linear behavior. The molecular devices described herein can store high or low conductivity states, and therefore function as static or dynamic random access memories.

The molecular devices described herein can exhibit memory effects. The electronic devices act as a memory device by the storage of a high or low conductivity state. The initial state is written into a perturbed state upon the application of a voltage pulse. The perturbed state persists as a stored bit, which is not changed by successive read pulses, which are also voltage pulses. Compounds with electron-withdrawing groups proximally bonded to the conductive path change their conductivity state. Other substituents can be provided in or proximate the conductive path, including electron-donating groups.

The initial state can be either a high conductivity or a low conductivity state. For example, a molecular device including a conductive path having both an electron-withdrawing group such as, for example, nitro, and an electron-donating group, such as, for example, acetamido or amino has an initial state which is a low conductivity state. Application of a voltage pulse converts this initial state into a high conductivity state, which persists, and is unaffected by subsequent voltage pulses of the same polarity, which can serve to read the state of the device. As another example, a molecular device can be prepared including a conductive path with an electron-withdrawing group such as nitro, and no electron-donating group present. While not wishing to be bound by any particular theory of operation, such a device appears to be reduced relatively readily upon application of a low potential, resulting in an apparent initial state, which is a high conductivity state. Application of a standard voltage pulse converts this apparent initial state into a low conductivity state which persists for a long time period.

For a device having current density of 50 A/cm$^2$, the low conductivity state can have a peak current of from about 50 pA to less than about 1 pA. For the same type of device, the high conductivity state can have a peak current of from about 1 nA to about 100 nA. Such devices thus exhibit on-off ratios in conductivity from about 200 to about 1000. This value is temperature dependent, and can be as high as about 1000 at 260 K.

Electronic Devices Utilizing Molecular Scale Devices

The molecular devices can be incorporated into electronic devices such as memory circuits, SRAM circuits as described herein.

Figure 4:
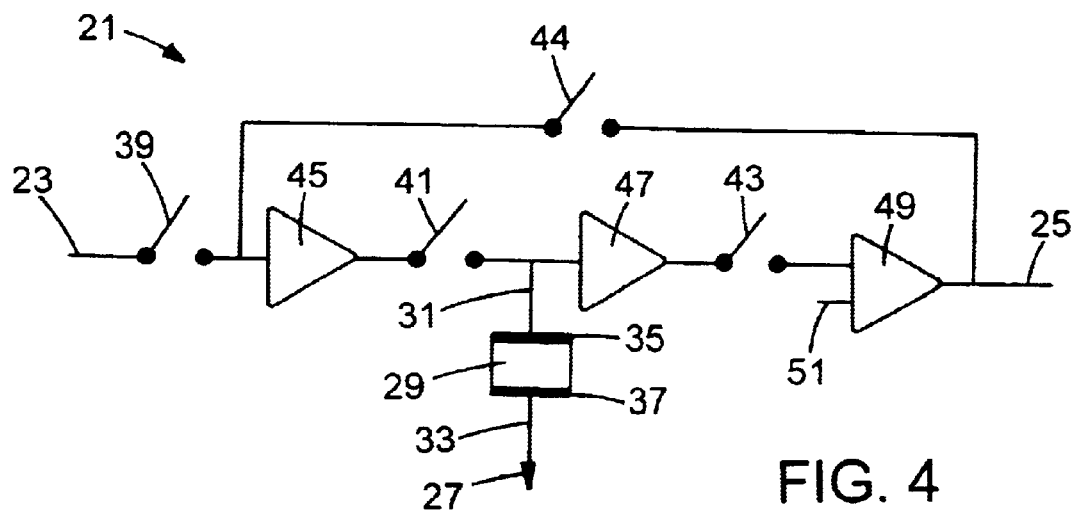
FIG. 4 is a schematic diagram of a memory circuit utilizing a particular molecular device.

A memory circuit utilizing a programmable molecular scale device is shown in FIG. 4. The figure shows memory circuit 21 including input 23, output 25 and ground 27. Memory element 29 is a molecular scale electronic device as described herein, with leads 31 and 33 connected to contacts 35 and 37, respectively. Switches 39, 41, 43 and 44 can be, for example, field effect transistors, that are controlled by address decoding circuitry, shown as toggles for simplicity. Amplifiers 45 and 47 are optional, depending on the resistance of the memory element 29. If its resistance is high, amplification can be found to be necessary. Comparator 49 is shown, also having $V_{ref}$ 51.

To write data in the memory, switches 39 and 41 are closed, thereby connecting memory element 29 to the input data through the amplifier 45. The switches are then opened. To read data from memory, the output switch 43 is closed to connect the memory element 29 to comparator 49, which "decides" whether the stored state is less than or greater than reference voltage 51. The output of comparator 49 is a logic "0" or a logic "1", depending on this result. To reset the memory state, switches 41 and 44 are closed.

This circuit can be employed in a memory array, according to methods and architectures known to those of skill in the art. For example, input and output can be separately connected to chip surfaces to define a grid system. Thus, the address of each memory circuit is unique.

Figure 5:
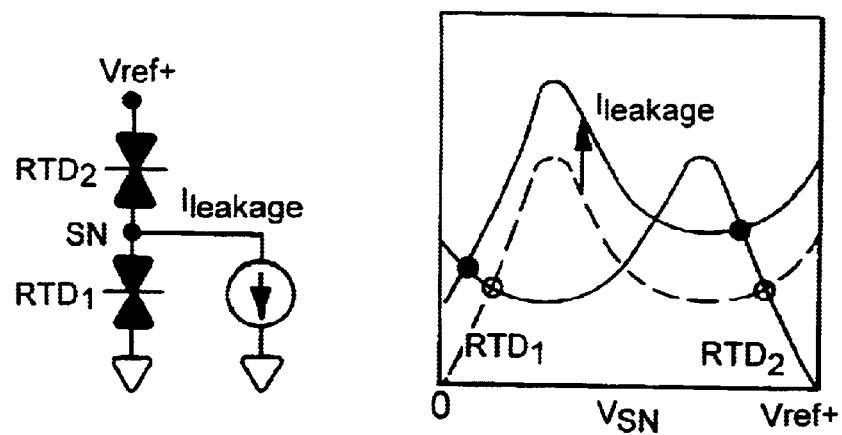
FIG. 5 is a schematic diagram of an SRAM cell using back-to-back negative differential resistance devices.

The molecular scale devices can also be included in static random access memory (SRAM) as described herein. FIG. 5 shows an SRAM circuit that can be made from molecular scale devices. SRAM cell 60 includes negative differential resistance devices 61 and 63, each of which is a molecular scale device as described herein. The RTD can be the same or of different composition. The two NDR devices are connected in back-to-back relationship with each other between a positive supply voltage Vref and ground. This produces a circuit that exhibits bistable operation. The I–V characteristics of each of the two NDR devices is plotted in FIG. 5, in which the dashed curve is for NDR1 and the solid curve terminating at ($V_{ref}$, 0) is for NDR2. As indicated in FIG. 5, the two devices connected in that way have two stable operating points, namely, the two points at which the two curves intersect, one above the NDR region and one below the NDR region. If there is an excess leakage current, $I_{leakage}$, at node SN, then one of the curves will be displaced upward as shown.

Switching from one stable point to the other is produced by supplying negative or positive current to node SN. If the current drawn out of node SN is sufficiently large, that will cause the circuit to switch from $VSN_{high}$ to $VSN_{low}$, where $VSN_{high} > NSN_{low}$. Conversely, if the current supplied to node SN is sufficiently large, that will cause the circuit to switch from $VSN_{low}$ to $VSN_{high}$.

Figure 6:
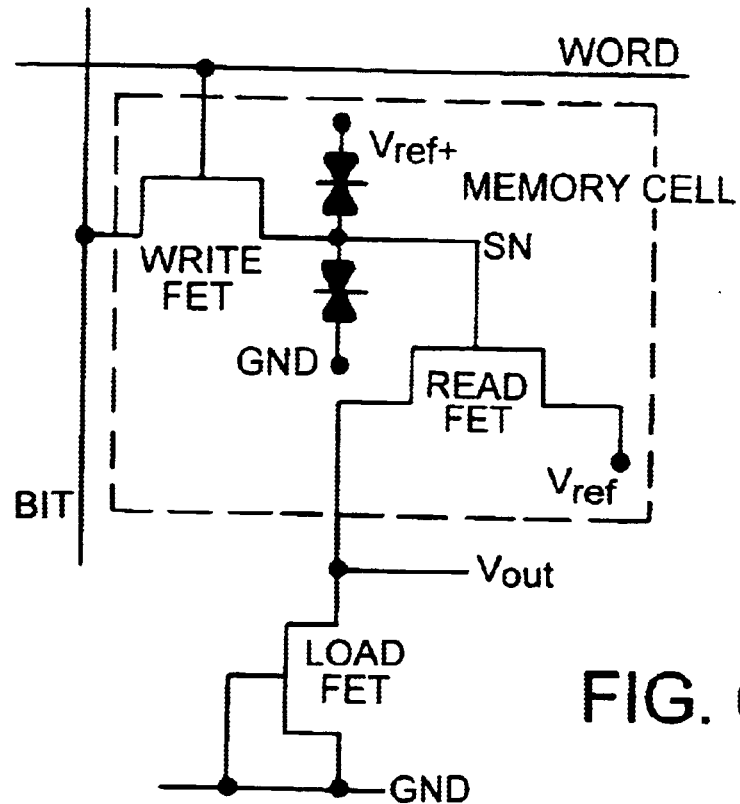
FIG. 6 is a schematic diagram of a basic SRAM circuit using back-to-back negative differential resistance devices with gain.

The circuit of FIG. 6 shows an embodiment of a basic SRAM cell in which the switching current is supplied by a write FET 70. The signal on word line 72 causes write FET 70 to write the signal on bit line 74 into the bistable circuit, thereby setting the voltage at node SN. The voltage at node SN, in turn, drives the gate of a read FET 76. Read FET 76, which has another FET 78 serving as its load, is either on or off, depending upon the voltage at node SN. When on, the voltage at $V_{out}$ will be high and when off, the voltage at $V_{out}$ will be low.

Figure 7:
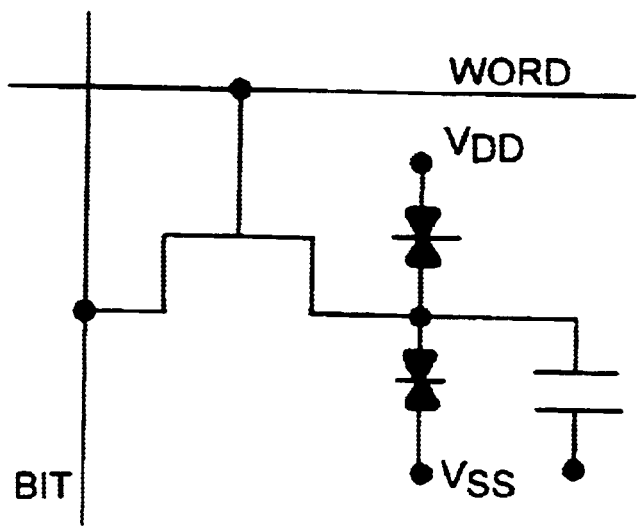
FIG. 7 is a schematic diagram of a basic SRAM circuit using back-to-back negative differential resistance devices without gain.

The circuit of FIG. 7 shows a simpler SRAM cell in which the read out circuit of FIG. 6 is replaced by a simple capacitor.

The invention will be further described in the following examples, which do not limit the scope of the invention described in the claims.

EXAMPLES

The following examples illustrate certain advantages and properties of particular embodiments of molecular devices and methods of making them. Certain general procedures will be described initially, followed by specific examples.

Example 1

General Conditions.

All reactions were performed under an atmosphere of nitrogen unless stated otherwise. Alkyllithium reagents were obtained from FMC Corporation (Chicago, Ill.). Pyridine, methyl iodide, triethylamine, and N,N-dimethylformamide (DMF) were distilled over calcium hydride, and stored over 4 Å molecular sieves. Toluene and benzene were distilled over $CaH_2$. Methylene chloride and hexanes were distilled. Ethyl ether and tetrahydrofuran (THF) were distilled from sodium benzophenone ketyl. Triethylamine and N,N-diisopropylethylamine were distilled over calcium hydride. Methanol (MeOH) was dried over oven dried 3 Å molecular sieves. $^1H$ NMR spectra were recorded at 300, 400, or 500 MHz on Brüker AM-300, WH-400, and AM-500 spectrometers, respectively or at 400 and 500 MHz on Varian Mercury 400 and INOVA 500 spectrometers, respectively. The $^{13}C$ NMR spectra were recorded at 75, 100, or 125 MHz on Brüker AM-300, WH-400, and AM-500 spectrometers, respectively at 100 and 125 MHz on Varian Mercury 400 and INOVA 500 spectrometers, respectively. Proton chemical shifts (δ) are reported in ppm downfield from tetramethylsilane (TMS) and $^{13}C$ resonances (unless otherwise noted) were recorded using the 77.0-ppm $CDCl_3$ resonance as an internal reference and are reported in ppm downfield from TMS. Infrared (IR) spectra were recorded on a Perkin Elmer 1600 Series FTIR. Gas chromatography experiments were performed on a Hewlett-Packard GC model 5890A equipped with an Alltech column (cat #932525, serial #9059) 25 m×0.25 mm D×0.2 mm. Gravity column chromatography, silica gel plugs, and flash chromatography were preformed using 230–400 mesh silica gel from EM Science. Thin layer chromatography was preformed using glass plates precoated with silica gel 60 $F_{254}$ with a layer thickness of 0.25 mm purchased from EM Science. Combustion analyses were obtained from Atlantic Microlab, Inc., P.O. Box 2288, Norcross, Ga. 30091.

Example 2

General Procedure for Coupling Terminal Alkynes With Aryl Halide

The general procedure for coupling terminal alkynes with aryl halides utilizes a palladium-copper cross-coupling protocol known as the Castro-Stephens/Sonogashira Protocol (Sonogashira, K.; Tohda, Y.; Hagihara, N. *Tet. Lett.* (1975), 4467. Stephans, R. D.; Castro, C. E. *J. Org. Chem.* (1963), 28, 3313. Suffert, J., Ziessel, R. *Tetrathedron Lett.* (1991), 32, 757. Blum, J.; Baidossi, W.; Badreih, Y.; Hoffmann, R. E.; Shumann, H. *J. Org. Chem.* (1995), 60, 4738).

To an oven dried round bottom flask equipped with a water cooled West condenser or screw capped pressure tube with a magnetic stirbar were added the aryl halide, bis (triphenylphosphine)palladium(II) dichloride (3–5 mol % per halide), and copper(I) iodide (6–10 mol % per halide). Triphenylphosphine was used in some reactions to keep the palladium in solution. The vessel was then sealed with a rubber septum under a $N_2$ atmosphere. A co-solvent system of THF, benzene, or methylene chloride was added at this point depending on the solubility of the aryl halide. Then base, either triethylamine or N,N-diisopropylethylamine, was added and finally the terminal alkyne (1–1.5 mol % per halide) was added and the reaction was heated until complete. Upon completion of the reaction, the reaction mixture was then quenched with water, a saturated solution of $NH_4Cl$, or brine. The organic layer was diluted with methylene chloride or $Et_2O$ and washed with water, a saturated solution of $NH_4Cl$, or brine (3×). The combined aqueous layers were extracted with methylene chloride or $Et_2O$ (2×). The combined organic layers were dried over $MgSO_4$ and solvent removed in vacuo to afford the crude product that was purified by column chromatography (silica gel). Eluents and other slight modifications are described below for each material.

Example 3

General Procedure for Deprotection of Trialkylsilyl-Protected Alkynes.

Two general methods were carried out for the deprotection of trialkylsilyl-protected alkynes. According to the first method, the silylated alkyne was dissolved in methanol and potassium carbonate was added. The mixture was stirred overnight before poured into water. The solution was extracted with ether or ethyl acetate and washed with brine. After drying over magnesium sulfate the solvent was evaporated in vacuo to afford pure products.

According to the second method, the silylated alkyne was dissolved in pyridine in a plastic vessel. A mixed solution of 49% hydrofluoric acid and 1.0 M tetrabutylammonium fluoride in THF was added at room temperature. The solution was stirred for 15 min and quenched with silica gel. The mixture was poured into water and extracted with ether. The extract was washed with brine and dried over magnesium sulfate. After filtration the solvent was evaporated in vacuo. The crude products were purified by a flash chromatography on silica gel. Eluents and other slight modifications are described below for each material.

Example 4

General Procedure for Conversion of Aryl Halide to Arylthioacetate.

To t-BuLi (2 equiv. per halide) in ether (5 mL) at −78° C. was added a solution of the aryl halide in THF. The slurry was stirred for 40 min and a slurry of sulfur powder (0.26 g, 8.0 mmol) in THF (10 mL) was added via cannula. The resulting green slurry was stirred for 1 h and then warmed to 0° C. The mixture was recooled to −78° C. and acetyl chloride (1.2 equiv. per halide) was added. The resultant yellow solution was allowed to warm to room temperature and stirred for 1 h before quenching with water. The mixture was extracted with ether (3×). The combined organic fractions were washed with water (2×) and dried over magnesium sulfate. Removal of solvents in vacuo followed by flash chromatography afforded the desired material. Eluents and other slight modifications are described below for each material.

Example 5

Synthesis of 2'-Amino-4,4'-diphenylethynyl-5'-nitro-1-thioacetylbenzene

The synthesis of a functionalized conductive path useful for constructing a molecular scale device is described below. The general synthetic procedure is presented in the following scheme:

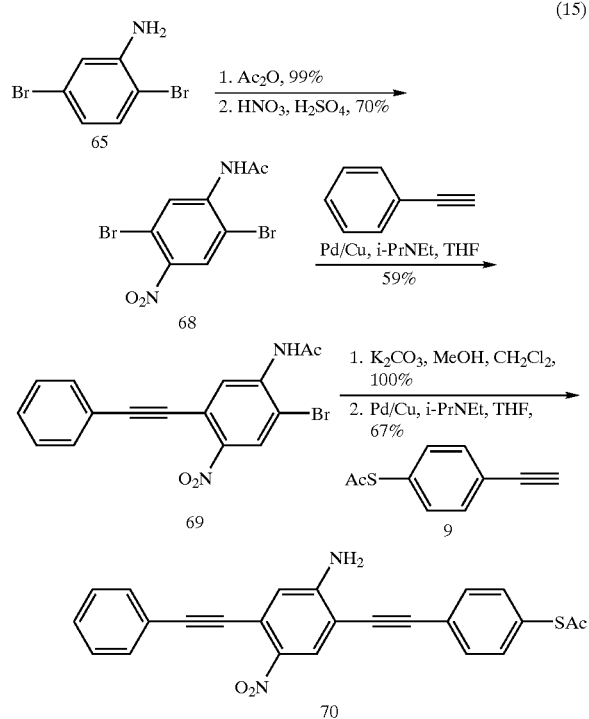

To synthesize the starting material, 2,5-dibromoacetanilide, to a 500 mL round bottom flask equipped with a magnetic stirring bar and a West condenser were added 2,5-dibromoaniline (1.38 g, 55.0 mmol), acetic anhydride (50 mL), and water (50 mL). The reaction mixture was allowed to heat to reflux for 12 h. The resultant mixture was cooled to ambient temperature and poured into water (500 mL). The precipitate was collected by filtration and further washed by water. The reaction afforded 14.25 g (88% yield) of 2,5-dibromoacetanilide.

To synthesize 2,5-dibromo-4-nitroacetanilide; to a oven dried 500 mL round bottom flask equipped with a magnetic stirring bar were added sulfuric acid (50 mL), and nitric acid (50 mL) and the reaction mixture was cooled to 0° C. Caution must be exercised during the synthesis of this compound to ensure that multiple nitrations are not carried out on the ring, which may lead to explosive, polynitrated compounds. 2,5-Dibromoacetanilide (14.25 g, 48.65 mmol) was added and the reaction mixture was allowed to stir for 2.5 h. Upon completion, ice (300 g) was added slowly to the reaction mixture. The reaction mixture was filtered and the solid collected. The desired material was purified by flash liquid chromatography using silica gel as the stationary phase and methylene chloride as the eluent. The reaction afforded 11.27 g (69% yield) of 2,5-dibromo-4-nitroacetanilide.

To synthesize 2-bromo-4-nitro-5-(phenylethynyl)acetanilide; the general procedure for the Pd/Cu-catalyzed coupling reaction was used. 2,5-Dibromo-4-nitroacetanilide (3.0 g, 8.88 mmol) was coupled to phenylacetylene (0.98 mL, 8.88 mmol) as described above using copper(I) iodide (0.17 g, 0.89 mmol), bis(triphenylphosphine)palladium(II) chloride (0.25 g, 0.44 mmol), triphenylphosphine (0.47 g, 1.78 mmol), N,N-diisopropylethylamine (6.18 mL, 35.52 mmol), and THF (25 mL) in an oven dried round bottom flask equipped with a West condenser and a magnetic stirring bar. The reaction mixture was allowed to react at room temperature for 1 d then was heated to 50° C. for 12 h. The resultant mixture was subjected to an aqueous workup as described above. The 2-bromo-4-nitro-5-(phenylethynyl)acetanilide was purified by gravity liquid chromatography using silica gel as the stationary phase and methylene chloride as the eluent. The reaction afforded 1.79 g (56% yield, first crop) of the desired product.

To synthesize 2-bromo-4-nitro-5-(phenylethynyl)aniline; the general procedure for the deprotection of trimethylsilyl-protected alkynes was used. To a 100 mL round bottom flask equipped with a magnetic stirbar 2-bromo-4-nitro-5-(phenylethynyl)acetanilide (0.33 g, 0.92 mmol), potassium carbonate (0.64 g, 4.6 mmol), methanol (15 mL), and methylene chloride (15 mL) was added. The reaction was allowed to stir at room temperature for 1 h. The reaction mixture was quenched with water and extracted with methylene chloride (3×). The organic layers were combined and dried over magnesium carbonate. Solvents were removed in vacuo. No further purification needed. The reaction afforded 0.29 g (100% yield) of 2-bromo-4-nitro-5-(phenylethynyl)aniline as a yellow solid.

To synthesize 2'-amino-4,4'-diphenylethynyl-5'-nitro-1-thioacetylbenzene; the general procedure for the Pd/Cu-catalyzed coupling reaction was used. 2-Bromo-4-nitro-5-(phenylethynyl)aniline (0.10 g. 0.30 mmol) was coupled to 1-thioacetyl-4-ethylnylbenzene (0.10 g, 0.56 mmol) as described above using copper(I) iodide (0.01 g, 0.03 mmol), bis(triphenylphosphine)palladium(II) chloride (0.01 g, 0.02 mmol), triphenylphosphine (0.02 g, 0.06 mmol), N,N-diisopropylethylamine (0.24 mL, 1.40 mmol), and THF (10 mL) in an oven dried round screw capped pressure tube equipped with a stirring bar. The reaction mixture was allowed to react at 80° C. for 3 d. The resultant mixture was subjected to an aqueous workup as described above. The 2'-amino-4,4'-diphenylethynyl-5'-nitro-1-thioacetylbenzene was purified by gravity liquid chromatography using silica gel as the stationary phase and 3:1 methylene chloride/hexanes as the eluent. An additional hexanes wash gave pure yellow crystals of 2'-amino-4,4'-diphenylethynyl-5'-nitro-1-thioacetylbenzene, 0.80 g (67% yield).

Example 6

Synthesis of 2'-Amino-4,4'-diphenylethynyl-5'-nitrobenzenisonitrile

A molecular scale device with an isonitrile attachment moiety was synthesized according to the scheme below. The starting material was prepared as described in Example 5. The amine moiety in intermediate 69 (2-bromo-4-nitro-5-(phenylethynyl)acetanilide) was unmasked with potassium carbonate and methanol, followed by Pd/Cu-catalyzed cross coupling with the formamide bearing compound 84 to afford compound 85 (2'-amino-4,4'-diphenylethynyl-1-formamido-5'-nitrobenzene). This intermediate was found to be insoluble in most solvent systems and therefore used directly in the next reaction.

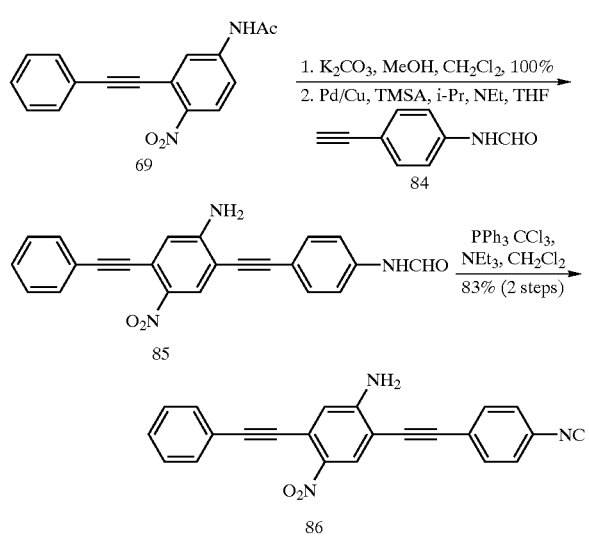

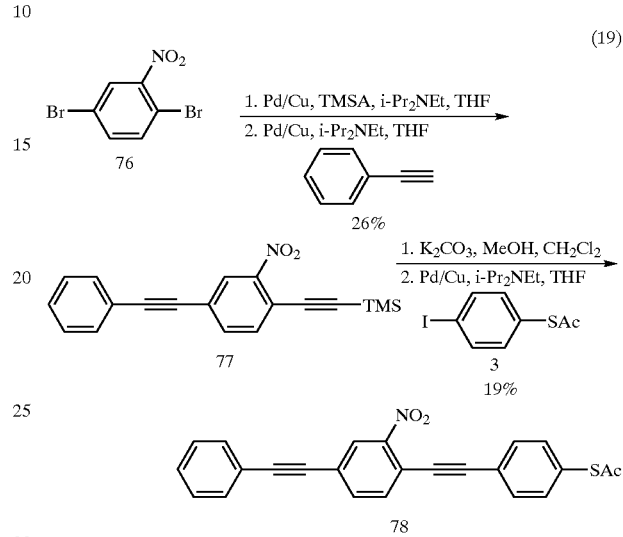

The formamide was dehydrated in the presence of carbon tetrachloride, triphenylphosphine, triethylamine, and methylene chloride to afford molecular scale device 2'-amino-4,4'-diphenylethynyl-5'-nitrobenzenisonitrile. The detailed synthesis is presented below.

The intermediate 69 (2-bromo-4-nitro-5-(phenylethynyl) acetanilide) was synthesized as in Example 5. To synthesize 2'-amino-4,4'-diphenylethynyl-1-formamido-5'-nitrobenzene; the general procedure for the Pd/Cu-catalyzed coupling reaction was used. 2-Bromo-4-ethynylphenyl-5-nitroaniline (69) (0.26 g, 0.83 mmol) was coupled to 1-ethynyl-4-formamidobenzene (85) (0.15 g, 1.00 mmol) as described above using copper(I) iodide (0.02 g, 0.08 mmol), bis(triphenylphosphine)palladium(II) chloride (0.03 g, 0.04 mmol), N,N-diisopropylethylamine (0.58 mL, 3.32 mmol), and THF (25 mL) in a screw capped pressure tube equipped with a magnetic stirring bar. The reaction mixture was allowed to stir at 70° C. for 3 days. The resultant mixture was subjected to an aqueous, workup as described above. The 2'-amino-4,4'-diphenylethynyl-1-formamido-5'-nitrobenzene was purified by gravity liquid chromatography using silica gel as the stationary phase and a mixture of 1:1 ethyl acetate/hexanes as the eluent. An additional purification was performed using gravity liquid chromatography using silica gel as the stationary phase and a mixture of ethyl acetate as the eluent. The reaction afforded an impure product of 0.23 g. The crude reaction product was taken on to the next synthetic step.

To synthesize 2'-amino-4,4'-diphenylethynyl-5'-nitrobenzenisonitrile (86); to an oven dried 100 mL round bottom flask equipped with a stirbar and a West condensor 2'-amino-4,4'-diphenylethynyl-1-formamido-5'-nitrobenzene (85) (0.04, 0.10 mmol), triphenylphosphine (0.09 g, 0.33 mmol), triethylamine (0.04 mL, 0.39 mmol), carbontetrachloride (0.03 mL, 0.31 mmol), and methylene chloride (10 mL) were added. The reaction was heated to 60° C. for 5 h. The reaction mixture was cooled and quenched with water and extracted with methylene chloride (3x). Organic layers were combined and dried over $MgSO_4$. Volatiles were removed in vacuo. The crude reaction mixture was purified by gravity liquid chromatography using silica gel as the stationary phase and ethyl acetate as the eluent. An additional purification was performed using gravity liquid chromatography using silica gel as the stationary phase and a mixture of 1:1 methylene chloride/hexanes as the eluent. The reaction afforded 0.03 g (83% yield, 2 steps) of 2'-amino-4,4'-diphenylethynyl-5'-nitrobenzenisonitrile.

Example 7
Synthesis of 4-(4'-(Phenylethynyl)-2'-nitro-1'-(ethynyl)phenyl)-1-(thioacetyl)benzene To determine the effects of an electron withdrawing moiety on electrical properties of these compounds, materials with solely a nitro moiety was synthesized.

2,5-Dibromonitrobenzene was subsequently Pd/Cu catalyzed with trimethylsilylacetylene to the more reactive bromide, ortho to the nitro moiety, and then to phenylacetylene that afforded intermediate (77). Deprotection of the terminal acetylene followed by coupling to the 1-iodo-4-thioacetylbenzene (3) afforded molecular scale device (78). A detailed synthetic procedure follows.

To synthesize 1-Bromo-3-nitro-4-(trimethylsilylethynyl) benzene; the general procedure for the Pd/Cu catalyzed coupling reaction was used. 2,5-dibromo-nitrobenzene (1.37 g, 4.89 mmol), bis(triphenylphospine) palladium (II) chloride (0.17 g, 0.25 mmol), copper (I) iodide (0.09 g, 0.49 mmol), and a stirbar were added to an oven-dried large screw cap tube. Air was removed and nitrogen backfilled (3x). THF (30 mL), Hünig's base (3.41 mL, 19.56 mmol), and trimethylsilylacetylene (0.69 mL, 4.9 mmol) were then added via syringe under nitrogen. The tube was capped and heated to 70° C. in an oil bath. After 18 h, the reaction flask was cooled to room temperature and quenched with $NH_4Cl$ solution. The organic products were extracted using $NH_4Cl$ solution and methylene chloride. Due to difficulty in separation of products, full isolation was not achieved and the resulting mixture was carried on to the next reaction step.

To synthesize 1-nitro-2-(trimethylsilylethynyl)-5-(phenylethynyl)benzene; the general procedure for the Pd/Cu catalyzed coupling reaction was used. Bis (triphenylphosphine) palladium (II) chloride (0.14 g, 0.20 mmol), copper (I) iodide (0.07 g, 0.40 mol), and a stir bar were added to an oven dried, large screw cap tube. The reaction mixture from the previous reaction was placed in a small flask and air removed and nitrogen backfilled (3x). Distilled THF was used to dissolve the mixture in the flask while under nitrogen and the resulting solution was transferred via syringe to the screw cap tube. Hünig's base (2.79 mL, 16.0 mmol) and phenylacetylene (0.57 mL, 5.2 mmol) were then added via syringe to the screw cap tube. The tube was capped and heated to 70° C. in an oil bath. After 3 d, the reaction tube was cooled to room temperature and quenched with NH$_4$Cl solution and extracted with methylene chloride to afford a thick red-brown oil. Column chromatography (silica gel with 2:1 hexanes/methylene chloride as eluent) afforded the desired product (0.172 g, 26% yield).

To synthesize 1-nitro-2-(ethynyl)-5-(phenylethynyl) benzene; the general procedure for the deprotection of a trimethylsilyl-protected alkyne was used. 1-nitro-2-(trimethylsilylethynyl)-5-(phenylethynyl)benzene (0.17 g, 0.53 mmol) was deprotected to the terminal alkyne via the procedure described above using potassium carbonate (0.36 g, 2.6 mmol), methanol (10 mL), and methylene chloride (10 mL). The mixture, in a round bottom flask, was stirred at room temperature for 2 hours. Extraction of the product followed the procedure described previously to yield 0.128 g of the desired product which was immediately reacted in the next step.

To synthesize 4-(4'-(phenylethynyl)-2'-nitro-1'-(ethynyl) phenyl)-1-(thioacetyl)benzene, the general procedure for the Pd/Cu catalyzed coupling reaction was used. 1-nitro-2-(ethynyl)-5-(phenylethynyl)benzene (0.13 g) was coupled with 4-thioacetyliodobenzene (0.19 g, 0.68 mmol) using the Pd/Cu cross coupling method described earlier using bis(triphenylphospine) palladium (II) chloride (0.019 g, 0.026 mmol), copper (I) iodide (0.01 g, 0.05 mmol), THF (30 mL), and Hünig's base (0.367 mL, 2.10 mmol) in an oven dried screw cap tube under nitrogen. The tube was stirred in a 60° C. oil bath for 23 h. The tube was then cooled to room temperature and quenched and extracted as stated before. Column chromatography (silica gel with 1:1 hexanes/methylene chloride as eluent) afforded the desired product (0.040 g, 18.8% yield over two steps) as a yellow solid.

Example 7

I(V) Characteristics of Molecular Electronic Devices

Negative differential resistance (NDR) was investigated for particular molecular devices described herein.

The starting substrate for the device fabrication was a 250 $\mu$m thick double side polished silicon (100) wafer, upon which 50 nm of low stress Si$_3$N$_4$ was deposited by low pressure chemical vapor deposition (LPCVD). On the back surface, the nitride was removed in a 400 $\mu$m×400 $\mu$m square by optical lithography and reactive ion etching (RIE). The exposed silicon was etched in an orientation dependent aniostropic etchant (35% KOH solution at 85° C.) through to the top surface, leaving a suspended 40 $\mu$m×40 $\mu$m silicon nitride membrane. A single hole of size 30–50 nm was made through the membrane by electron beam lithography and RIE. Because of the strained geometry, the RIE rates were substantially reduced so that the far side opening was much smaller than actually patterned, thereby rendering the cross-section of a bowl-shaped geometry. A metallic gold contact of 200 nm thickness was evaporated onto the topside of the membrane, which filled the pore with gold. The sample was then immediately transferred into a solution of 2'-amino-4-ethynylphenyl-4'-ethynylphenyl-5'-nitro-1-(thioacetyl) benzene (0.5 mM in THF) and ammonium hydroxide (con. Aq., 5 $\mu$L per mg of 1-(thioacetyl)benzene) for the self-assembly to occur over a period of 48 hours, under an inert atmosphere of argon. The sample was then rinsed, quickly loaded into a vacuum chamber and mounted on a liquid nitrogen cooling stage for the bottom gold electron evaporation, in which 200 nm of gold was evaporated at 77 K at a rate of less than 1 Å per second. The devices were then diced into individual chips, bonded onto packaging sockets, and loaded into a variable temperature cryostat (Janis), and measured with a HP4145 Semiconductor Parameter Analyser.

A series of control experiments were done with alkanethiol-derived conductive paths in SAM, using silicon-nitride membranes without pores, and membranes with pores but without conductive paths. Both the gold-alkanethiolate-gold, and the gold-silicon nitride membrane-gold junctions showed current levels at the noise limit of the apparatus (less than 1 pA) for both bias polarities at both room and low temperatures (60 K). A device containing a SAM of conductive paths without nitro or amine functionalities did not exhibit negative differential resistance behavior under similar experimental conditions.

Figure 8:
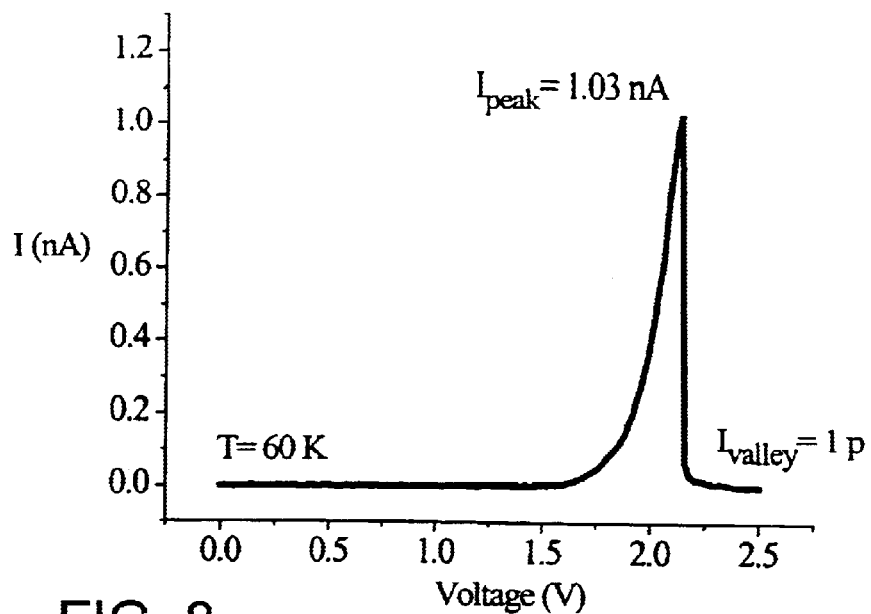
FIG. 8 is a plot of current vs. voltage for a particular molecular device.

FIG. 8 is a plot of the I(V) characteristics of a gold-(2'-amino-4-ethynylphenyl-4'-ethynylphenyl-5'-nitro-1-benzenethiol)-gold molecular electronic device. The measurement was made at 60 K. The current vs. voltage plot is fully reversible upon change in bias sweep direction. Positive bias corresponds to hole injection in the thiol end of the conductive path, electron injection from the evaporated contact end. The peak to valley ratio (PVR) exceeds $10^3$. This performance exceeds that observed in typical solid state quantum well resonant tunneling heterostructures. The intrinsic PVR for such devices may be larger than that reported here due to typical leakage currents in the silicon nitride.

Figure 9:
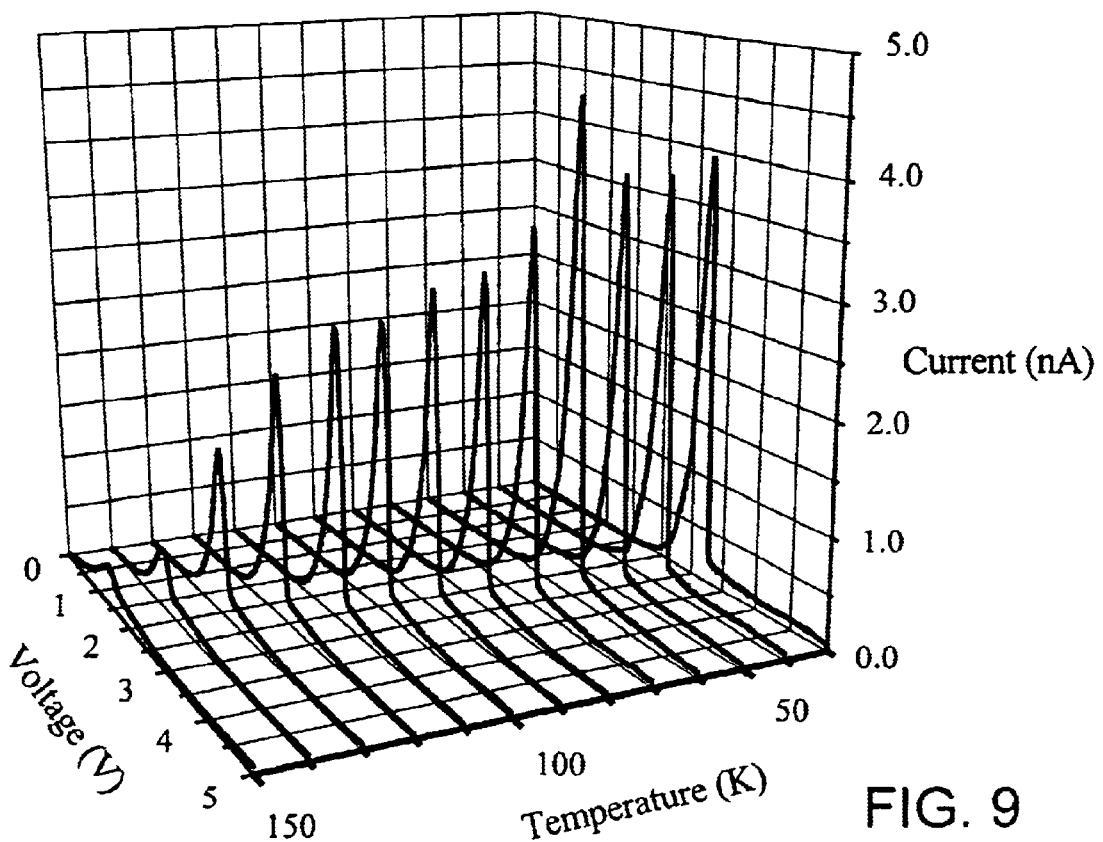
FIG. 9 is a plot of current vs. voltage vs. temperature for a particular molecular device.

FIG. 9 shows I(V,T) characteristics of a Au-(2'-amino-4-ethynylphenyl-4'-ethynylphenyl-5'-nitro-1-benzenethiolate)-Au device. This device exhibited peak voltage position and current magnitude shifts with temperature, shown in FIG. 9.

Example 8

Observation of High-Conductivity Memory Effects in Molecular Electronic Devices

The compound 2'-amino-4,4'-diphenylethynyl-5'-nitro-1-benzenethiolate was incorporated into a gold contacted nanopore, as described in Example 7. An initially low conductivity state was written into a high conductivity state upon application of a voltage pulse.

Figure 10:
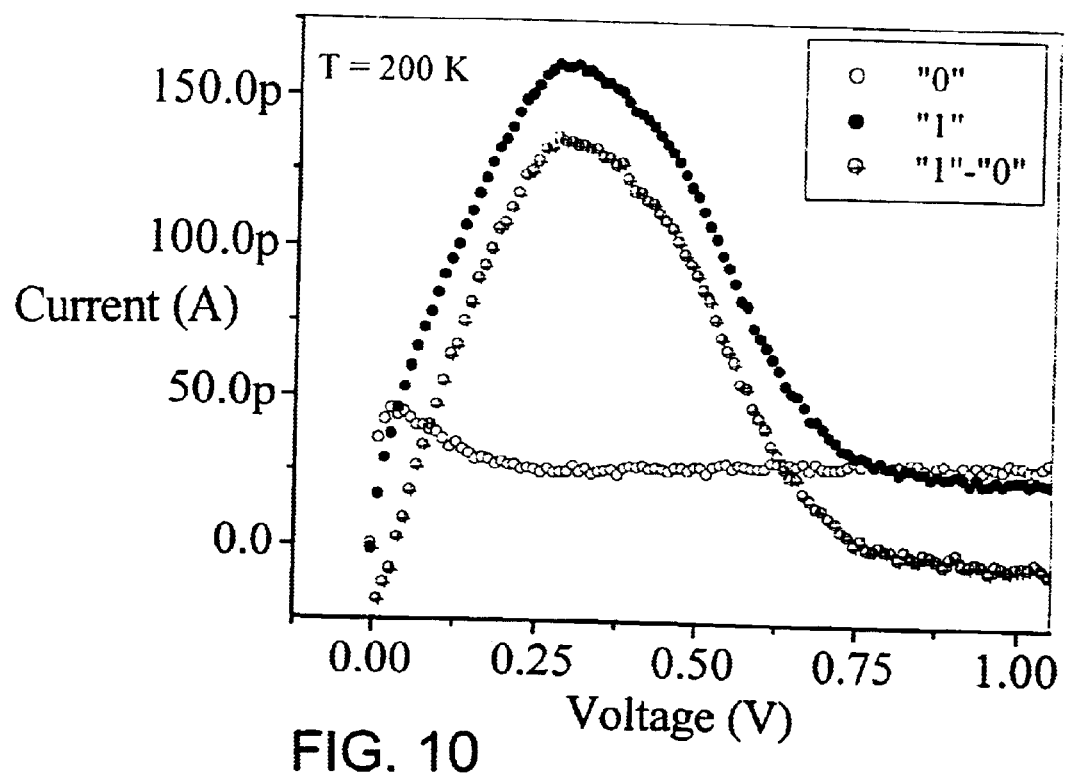
FIG. 10 is a plot of current vs. voltage for a particular molecular device, including initial and written states.

FIG. 10 shows the I(V) characteristics of a Au-(2'-amino-4,4'-diphenylethynyl-5'-nitro-1-benzenethiolate)-Au at 200 K, initially (defined as "0"), and after a write pulse (defined as "1"), and the difference between the two states (defined as "1"–"0"). These characteristics were measured under a low bias, high temperature regime. Positive bias corresponds to hole injection from the thiol-gold contact. The device initially probed with a positive voltage exhibits a low conductivity state. Subsequent positive sweeps show a high conductivity state with I(V) characteristics identical to the previous values ("1"). Device bias swept in the reverse bias direction causes the I(V) to be identically reset to the initial ("0" in this case) I(V) characteristic. The characteristics are repeatable to high accuracy, and device degradation is not observed.

Figure 11:
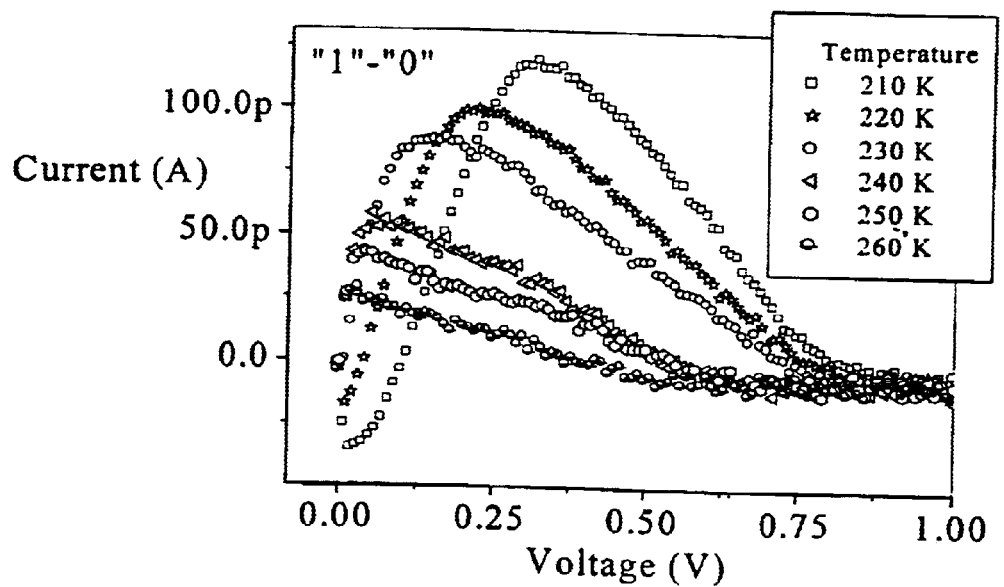
FIG. 11 is a plot of the difference between the initial and written states, described in FIG. 10.
Figure 12:
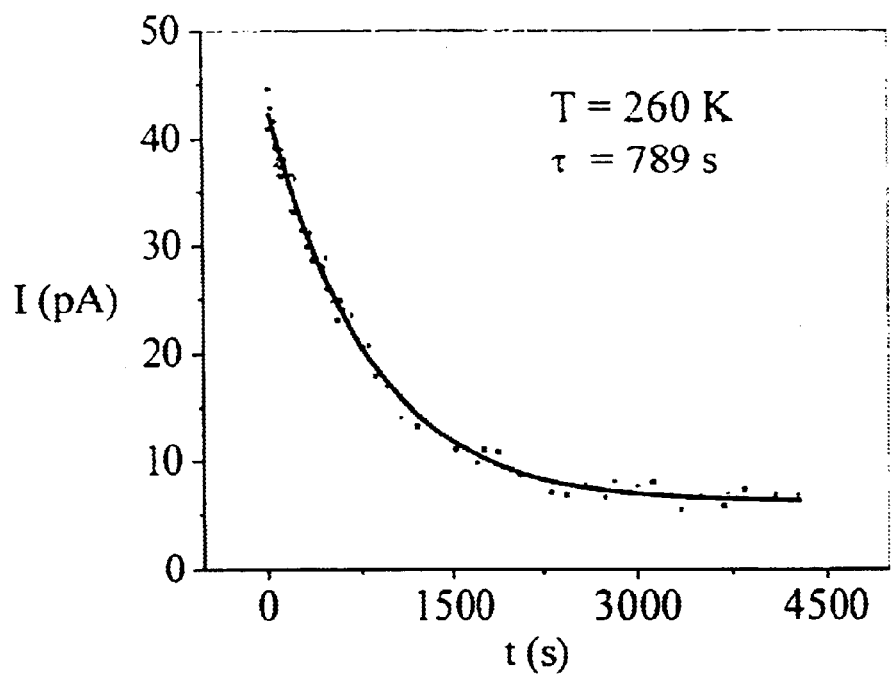
FIG. 12 is a plot of bit retention measured as current vs. time, giving a bit retention time constant ($\tau$).

FIG. 11 shows the difference characteristic ("1"–"0") of this system (Au-(2'-amino-4,4'-diphenylethynyl-5'-nitro-1-benzenethiolate)-Au) as a function of temperature. The peak current difference decreases approximately linearly with increasing temperature over the investigated range.

Example 9

Bit Retention Time

A characteristic bit retention time was obtained by measuring the stored high conductivity state at various time intervals after programming the Au-(2'-amino-4,4'-diphenylethynyl-5'-nitro-1-benzenethiolate)-Au device of Example 7. After an initial write bias sweep, the peak current of the stored state "1" exhibits an exponential decay with a time constant ($\tau$) of 790 seconds at 260 K. as shown in FIG.

Figure 13:
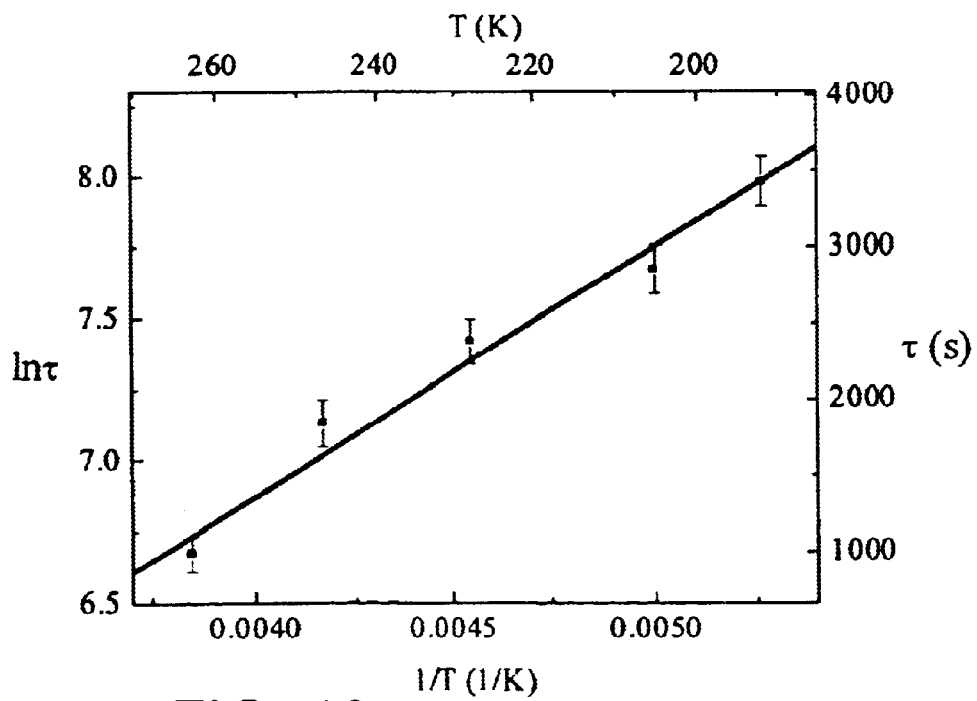
FIG. 13 is a plot of the temperature dependence of $\tau$, giving an activation energy.

12. Measurements of the bit retention time at different temperatures yields an exponential dependence, with 1/T, indicating an activated behavior as shown in FIG. 13. The behavior is described by $\tau = \tau_o \, e^{(Fa \cdot kT)}$. The activation energy over this bias regime was found to be approximately 76±7 meV for this system.

Example 10
Observation of Low-Conductivity Memory Effects in Molecular Electronic Devices The compound 4,4'-diphenylethynyl-2'-nitro-1-benzenethiolate was incorporated into a gold contacted nanopore, as described in Example 7. An initially high conductivity state was written into a low conductivity state upon application of a voltage pulse.

Figure 14:
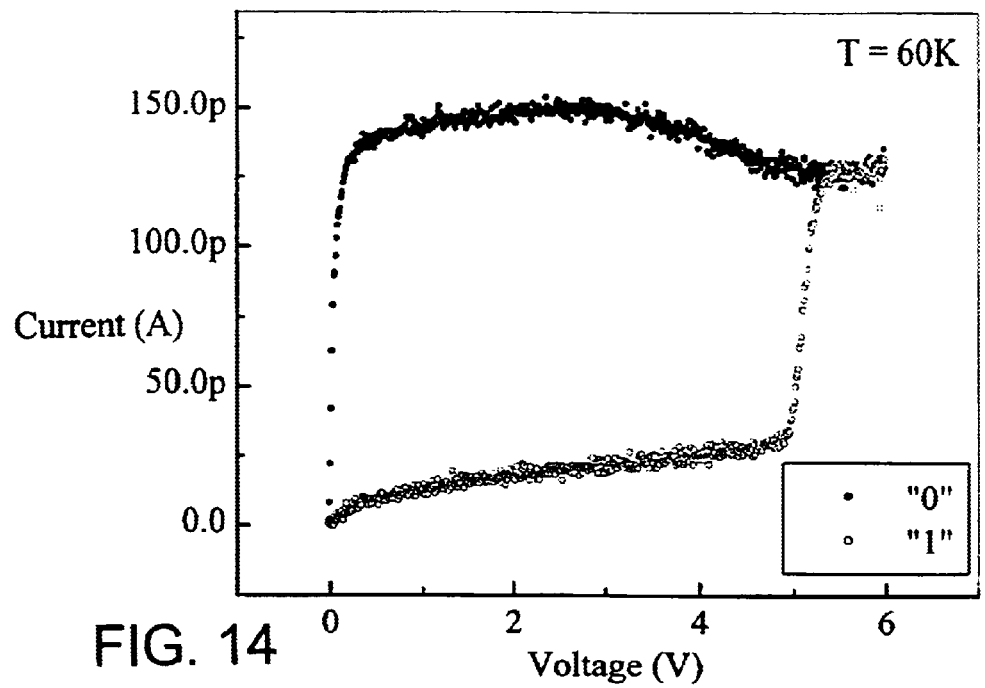
FIG. 14 is a plot of current vs. voltage of stored and initial/erased states for a particular molecular device at 60 K.
Figure 15:
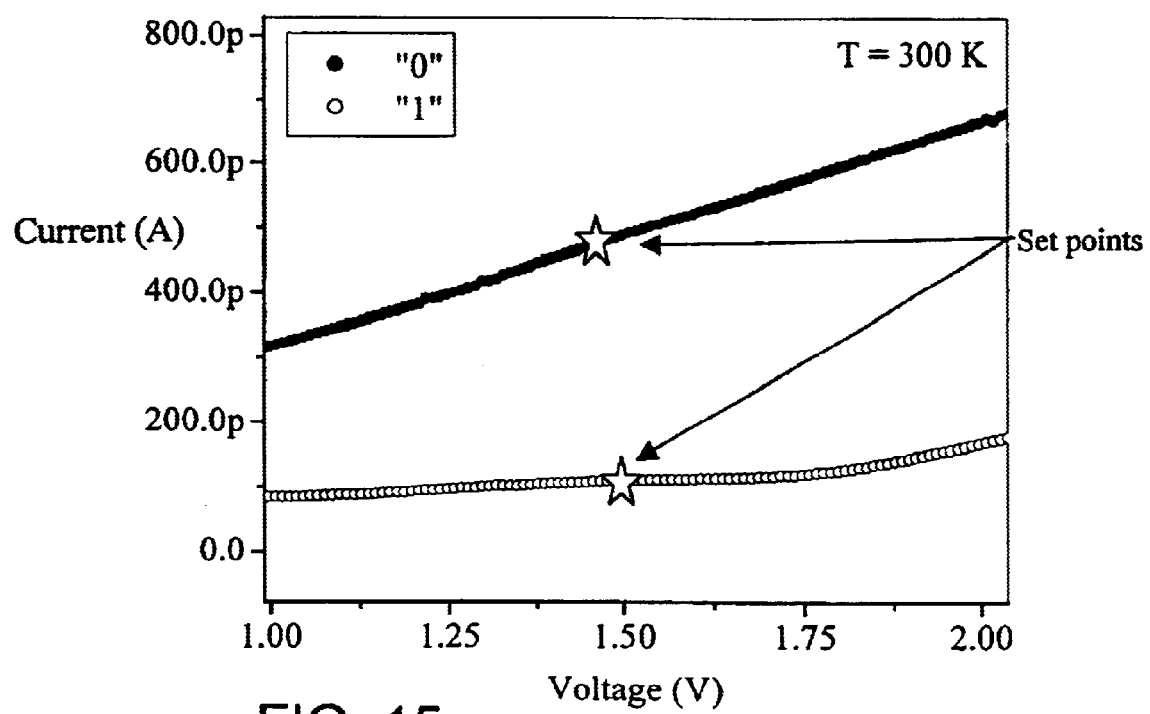
FIG. 15 is a plot of current vs. voltage of stored and initial/erased states for a particular molecular device at 300 K.

FIG. 14 shows the storage of this state in the system at 60 K. FIG. 15 shows this storage at 300 K. The window over which the "0" and "1" states differ by a constant amount of approximately 150 pA is nearly 5 volts, providing well separated thresholds. As described previously, subsequent read pulses and reset pulses identically recovered the I(V) characteristics. At 300 K, thermal activation does contribute some non-zero "0" current, although the thresholds are still well-separated (between 200 and 500 pA). The set points indicated (ca. 1.5 V and ca. 500 pA for "0", and ca. 1.5 V and ca. 100 pA for "1") are the operating points for the circuit described below in Example 11.

Example 11
Molecular Logic Diagram

Figure 16:
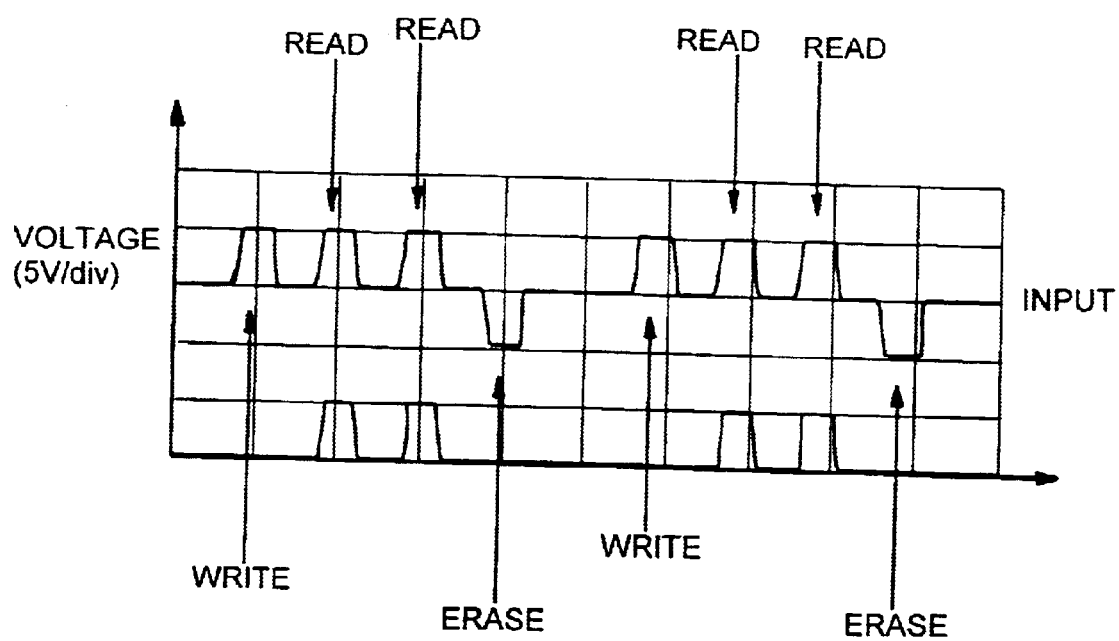
FIG. 16 is a measured logic diagram demonstrating memory characteristics of a particular molecular device.

FIG. 16 is a measured logic diagram demonstrating a random access memory (RAM) cell operating at ambient temperature using molecular scale electronic devices. The compound 4,4'-diphenylethynyl-2'-nitro-1-benzenethiolate was incorporated into a gold contacted nanopore, as described in Example 7. To convert the stored conductivity to standard voltage conventions, the output of the device was dropped across a resistor, sent to a comparator (set at the points diagrammed in FIG. 15, and inverted and gated with the read pulse. The upper trace shown in FIG. 16 is an input waveform applied to the device, and the lower trace is the RAM cell output. The first positive pulse configures the state of the cell by writing a bit, and the second and third positive pulses read the cell. The third pulse (and subsequent read pulses, not shown) demonstrates that the RAM cell is robust and continues to hold the state up to the limit of the bit retention time at this temperature. The negative pulse erases the bit, resetting the cell. The second set of four pulses repeats this pattern, and many hours of continuous operation have been observed with no performance degradation.

Example 12
Observation of Room Temperature NDR

Figure 17:
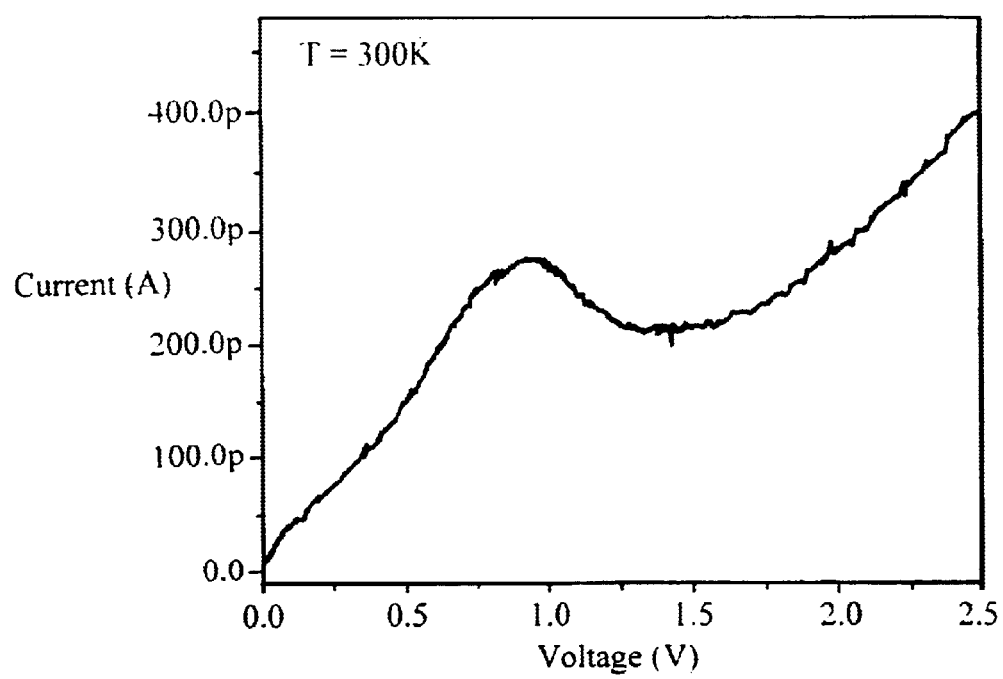
FIG. 17 is a plot of current vs. voltage for a particular molecular device at 300 K.

FIG. 17 is a plot of the I(V) characteristic of a gold-(-4-ethynylphenyl-4'-ethynylphenyl-5'-nitro-1-benzenethiolate)-gold molecular electronic device at 300 K. The peak to valley ratio (PVR) is smaller than that of the compound shown in Example 7, but NDR behavior persisted from low temperature.

Figure 18:
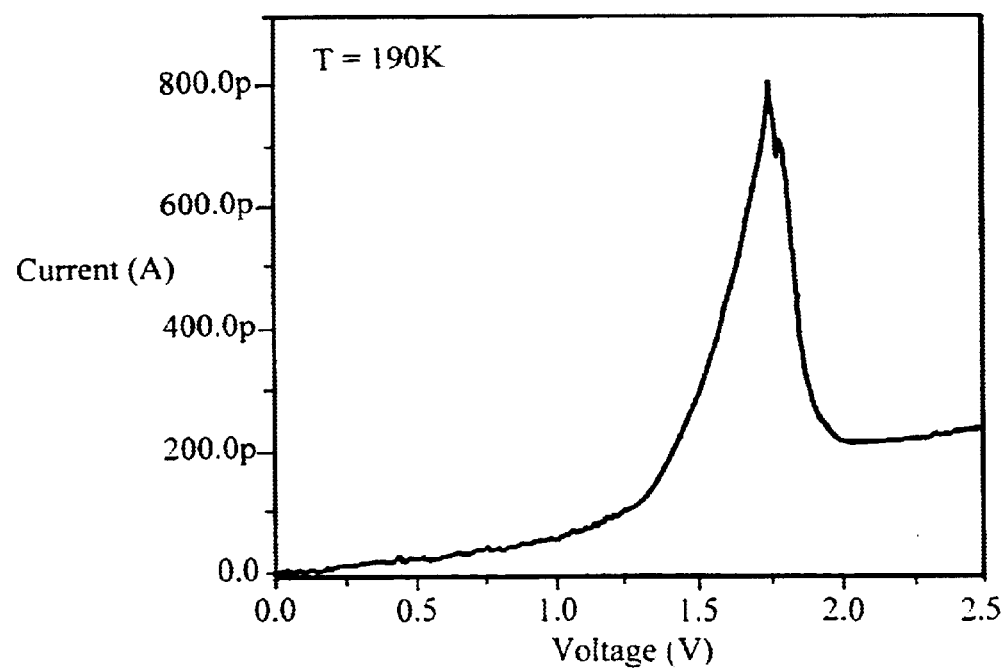
FIG. 18 is a plot of current vs. voltage for a particular molecular device at 190 K.

The device has a peak current density of greater than 16 A/cm$^2$, and NDR of less than $-144$ m$\Omega$cm$^2$ and a PVR of ~1.5:1. FIG. 18 shows the I(V) characteristics of the same device at 190 K. The NDR peak is sharper, and the PVR is approximately 4:1. The reduction potential difference for this system is also roughly equal to the width of the I(V) peak.

Example 13
Cyclic Voltammetry of Molecular Scale Devices

Figure 19:
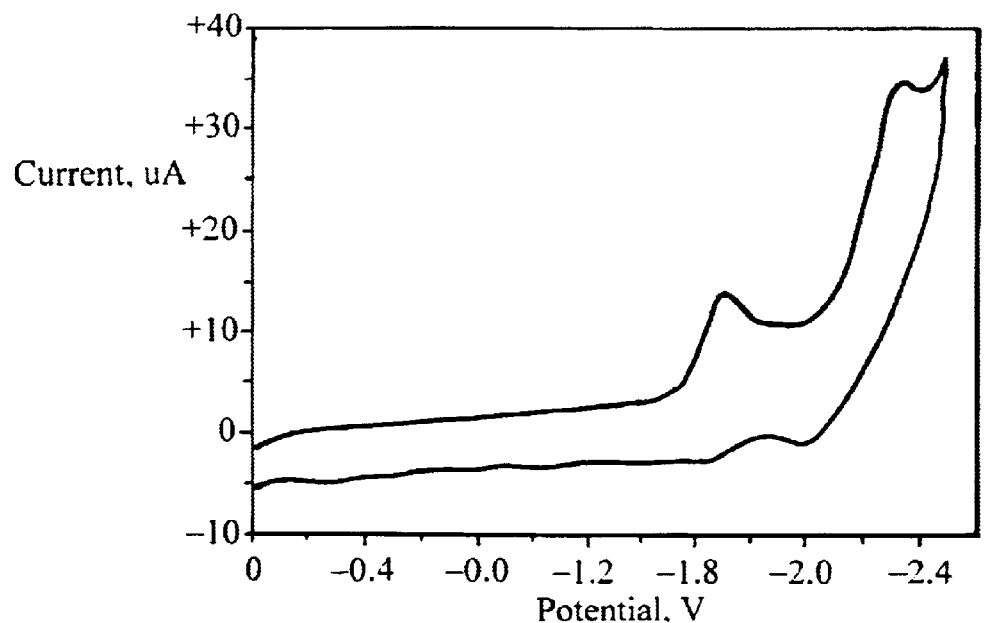
FIG. 19 is a cyclic voltammagram for a particular molecular device.

Cyclic voltammetry measurements of 4,4'-diphenylethynyl-5'-nitro-1-benzenethiolate were performed at room temperature on a BAS CV-50W voltametric analyzer using an Ag/AgNO3 reference electrode, and solvent system of dimethylformide and 1M n-tetrabutylammoniumfloraborate with a scan rate of 100 mV/sec. FIG. 19 shows the cyclic voltammetry reduction curve where the first and the second reduction potential for compound 4,4'-diphenylethynyl-5'-nitro-1-benzenethiolate is 1.68 V and 2.33 respectively.

Figure 20:
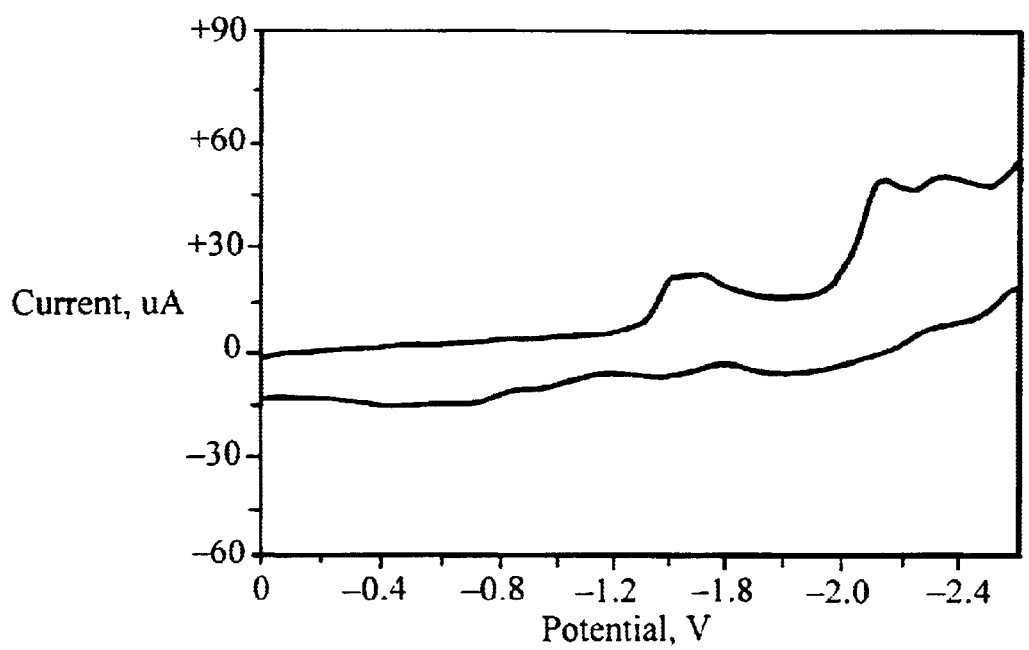
FIG. 20 is a cyclic voltammagram for a particular molecular device.

FIG. 20 shows the cyclic voltammagram curve for 2'-amino-4,4'-diphenylethynyl-5'-nitro-benzenethiolate where the reductin potentials peaked at 1:4 V and 2.2 V respectively. The reduction potential difference is in approximate agreement with the width of the I(V) peak. The fact that 2'-amino-4,4'-diphenylethynyl-5'-nitro-benzenethiolate is more readily reduced than 4,4'-diphenylethynyl-5'-nitro-1-benzenethiolate (the reduction potential of 2'-amino-4,4'-diphenylethynyl-5'-nitro-benzenethiolate is 0.3 V less than that of 4,4'-diphenylethynyl-5'-nitro-1-benzenethiolate could be responsible for the observation of room temperature NDR in 2'-amino-4,4'-diphenylethynyl-5'-nitro-benzenethiolate but not in 4,4'-diphenylethynyl-5'-nitro-1-benzenethiolate.

Other Embodiments

It is to be understood that while the invention has been described in conjunction with the detailed description thereof, the forgoing description is intended to illustrate and not limit the scope of the invention, which is defined by the scope of the appended claims. Other aspects, advantages, and modifications are within the scope of the following claims.

What is claimed is:

1. An electronic device comprising:
   at least two contacts; and
   a monolayer of conductive organic material forming a conductive path between said contacts,
   wherein said conductive path includes alternating ethynyl and aryl groups with at least one phenyl-ethynyl linkage, and at least one nitro electron withdrawing group.

2. The device of claim 1, wherein said device exhibits high and low conductivity states.

3. The device of claim 2, wherein said high and low conductivity states are persistent and said device is repeatedly switchable between said persistent high and said low conductivity states.

4. The device of claim 2, wherein said low conductivity state has a current of less than about 100 pA.

5. The device of claim 4, wherein said low conductivity state has a current of less than about 1 pA.

6. The device of claim 2, wherein said high conductivity state has a current at least about 200 times higher than said low conductivity state.

7. The device of claim 6, wherein said high conductivity state has a current at least about 500 times higher than said low conductivity state.

8. The device of claim 7, wherein said high conductivity state has a current at least about 1000 times higher than said low conductivity state.

9. The device of claim 1, wherein said nitro electron withdrawing group is bonded to a phenyl ring in the conductive path.

10. The device of claim 1, further comprising at least one electron donating group.

11. The device of claim 1, wherein said conductive path comprises atoms, at least 70% of said atoms being sp- or $sp^2$-hybridized atoms.

12. The device of claim 1, wherein said conductive path further comprises binding groups which bind said conductive path to said contacts.

13. The device of claim 12, wherein said binding groups are selected from the group consisting of sulfur atoms, oxygen atoms, cyano, carboxy, diazonium salt, halide, isocyano, phosphine, and tellurium and selenium atoms.

14. The device of claim 1, wherein said conductive path comprises biphenyl groups.

15. The device of claim 1, wherein the device exhibits negative differential resistance at room temperature.

16. An electronic device comprising:
- two contacts, wherein at least one contact is a palladium contact; and
- a self-assembled monolayer of a conductive organic molecule comprising a phenyl-ethynyl-substituted phenyl-ethynyl-phenyl linkage between said contacts, wherein said substituted phenyl includes at least one nitro group, and wherein said organic molecule is bonded to said palladium contact by at least one isocyano group on a terminal phenyl of said linkage.

\* \* \* \* \*